(12) United States Patent
Talor

(10) Patent No.: US 6,933,085 B1
(45) Date of Patent: Aug. 23, 2005

(54) TRANSPARENT PHASE SHIFT MASK FOR FABRICATION OF SMALL FEATURE SIZES

(75) Inventor: George Talor, Trabuco Canyon, CA (US)

(73) Assignee: Newport Fab, LLC, Newport Beach, CA (US)

( * ) Notice: Subject to any disclaimer, the term of this patent is extended or adjusted under 35 U.S.C. 154(b) by 91 days.

(21) Appl. No.: 10/431,073

(22) Filed: May 6, 2003

Related U.S. Application Data

(63) Continuation-in-part of application No. 10/291,116, filed on Nov. 8, 2002, now Pat. No. 6,716,558, which is a continuation of application No. 09/499,244, filed on Feb. 7, 2000, now Pat. No. 6,479,194.

(51) Int. Cl.$^7$ .............................. G03F 9/00; G03C 5/00
(52) U.S. Cl. ........................ 430/5; 430/322; 430/323; 430/324; 430/394
(58) Field of Search ........................ 430/5, 322–324, 430/394

(56) References Cited

U.S. PATENT DOCUMENTS 6,479,194 B1 * 11/2002 Talor, Jr. ........................ 430/5
6,531,250 B2 * 3/2003 Kim .............................. 430/5
6,716,558 B1 * 4/2004 Talor, Jr. ........................ 430/5

* cited by examiner

Primary Examiner—Geraldine Letscher
(74) Attorney, Agent, or Firm—Farjami & Farjami LLP

(57) ABSTRACT

In one exemplary embodiment, a resolution enhancement phase shift mask comprises a transparent substrate having a first clear region, a second clear region and a third clear region. An opaque film, such as chrome, is situated over at least a portion of the transparent substrate to define an opaque region. The transparent substrate can be formed of quartz or calcium fluoride, for example. The second and third clear regions have equal thicknesses. However, the first clear region has a thickness different from each of the second and third clear regions. The difference in thickness between the first clear region and the second and third clear regions is calculated to cause a 180 degree phase shift in light passing through the first clear region relative to a phase of light passing through each of the second and third clear regions. The destructive interference caused at the phase boundaries of the first clear region and the second and third clear regions results in a dark unexposed area on the surface of an underlying photoresist layer; the dark unexposed area having geometry and dimensions corresponding to the geometry and dimensions of the first clear region.

20 Claims, 19 Drawing Sheets

Alternating Phase Shift Mask

Attenuated Phase Shift Mask

TRANSPARENT PHASE SHIFT MASK FOR FABRICATION OF SMALL FEATURE SIZES

RELATED APPLICATIONS

The present application is a Continuation-In-Part of and claims priority to U.S. application Ser. No. 10/291,116, filed on Nov. 8, 2002 now U.S. Pat. No. 6,716,558, which itself is a Continuation of U.S. application Ser. No. 09/499,244, filed on Feb. 7, 2000, now issued as U.S. Pat. No. 6,479,194. The above-mentioned patent application and patent are hereby fully incorporated by reference in the present application.

BACKGROUND OF THE INVENTION

1. Field of the Invention

The present invention is in the field of fabricating semiconductor wafers. More particularly, the invention is in the field of photolithographic masks used to fabricate semiconductor wafers.

2. Background Art

Photolithography is used extensively in the semiconductor industry to form a desired pattern on the surface of a semiconductor wafer. Typically, the photolithographic process begins by coating the surface of a silicon wafer with photoresist. Conventionally, a "binary mask" having fully non-transmittive opaque regions made of chrome, and fully light transmittive transparent regions made of quartz, is then positioned over the surface of the photoresist coated wafer. Typically a lens system of a stepper is used to shine visible or ultra-violet light on the binary mask. This light passes through the transparent regions of the mask and exposes the corresponding regions of the underlying photoresist layer, and is blocked by the opaque regions of the mask, leaving the corresponding regions of the photoresist layer unexposed. The photoresist layer is then developed by chemical removal of the exposed or non-exposed regions (depending on whether a positive or a negative resist has been used). The end result is a silicon wafer and the desired pattern of photoresist thereon. This pattern can then be used for etching underlying regions of the silicon wafer.

A major shortcoming of the conventional binary mask is that it cannot be effectively used to pattern feature sizes which are substantially smaller than the exposure wavelength. For feature sizes smaller than the exposure wavelength, the use of the binary mask requires the maximum attainable numerical aperture of the lens system. However, as the numerical aperture is increased, the depth of field of the lens system is reduced. Since the surface of the silicon wafer is not optically flat, the reduction of depth of field of the lens system translates into poor focus in various regions of the silicon wafer. Thus, as the minimum feature size is reduced, the limits of the conventional binary mask are reached.

To overcome the limitations of the binary mask, one technique involves use of an "alternating phase shift mask." An example of an alternating phase shift mask is mask 102 in FIG. 1A. Referring to mask 102 in FIG. 1A, a fully opaque material such as chrome is used in region 106 of mask 102. Chrome region 106 is flanked by transparent regions 104 and 108. Transparent regions 104 and 108 are typically made of quartz. The thickness of quartz region 108 is approximately 2280 Angstroms less than that of quartz region 104. The thickness of region 108 is calculated such that light passing through region 108 has a phase shift of 180 degrees relative to light passing through the thicker region 104 which has no phase shift, i.e. a phase shift of 0 degrees.

The 180 degree phase shift induced in light passing through quartz region 108 results in destructive interference between light passing through quartz region 108 and that passing through quartz region 104. Graph 120 in FIG. 1A shows the approximate intensity of light under regions 104, 108, and 106. The opposite phases of light passing through the 0 degree phase shift region 104 and light passing through the 180 degree phase shift region 108 cancel, resulting in a dark unexposed region 116 on the surface of the photoresist coated wafer. As shown in FIG. 1A, the dark unexposed region 116 falls on an area of the photoresist layer which is located below chrome region 106.

Although small feature sizes can be patterned by using an alternating phase shift mask such as mask 102 in FIG. 1A, alternating phase shift masks have various shortcomings. For example, reference to graph 120 in FIG. 1A illustrates that the intensity of light passing through the 0 degree phase shift region 104 is greater (having peak 114) than the intensity of light passing through the 180 degree phase shift region 108 (having peak 112). The difference in intensity causes an unbalanced exposure of the photoresist layer such that areas of photoresist under mask region 108 are underexposed while areas of photoresist under mask region 104 are overexposed.

The above-described imbalance in intensity and image position of the conventional alternating phase shift mask is a great disadvantage and in an attempt to overcome this disadvantage a "dual trench" alternating phase shift mask has recently been devised. In the dual trench alternating phase shift mask, quartz from both regions 104 and 108 is etched to different depths so that, while maintaining the 180 degree phase shift of region 108 relative to region 104, the intensity of light under both regions 104 and 108 is almost equalized. However, the dual trench results in a shift in the center of focus of light passing through one trench with respect to the center of focus of light passing through the other trench. Moreover, the dual trench alternating phase shift mask is more difficult to manufacture since quartz from both regions 104 and 108 has to be etched to precise, but different, depths in order to balance the intensity of light passing through both regions 104 and 108.

Moreover, according to the dual trench alternating phase shift mask (and also the conventional alternating phase shift mask), the use of a first mask results in creation of artifacts at the boundaries between the 0 degree phase shift and the 180 degree phase shift regions. Accordingly, a second mask is required for a second exposure in order to erase the artifacts created by the first mask during the first exposure. The requirement that two masks (and two exposures) must be used increases the complexity of the photolithographic process, results in a need for an accurate alignment between the first and second exposures, reduces the throughput of processing the semiconductor wafer, and is more costly than a single mask, single exposure method.

A technique is disclosed in U.S. Pat. No. 5,858,580 to Wang et al utilizing a two-mask, two-exposure approach. A first "phase shift mask" consists of a "control chrome" that is flanked by 0 degree and 180 degree phase regions. Regions in the first mask other than the control chrome, 0 degree, and 180 degree phase regions are covered by a "phase shift mask chrome." A dark unexposed area under the "control chrome" is created at the phase boundaries of the 0 degree and 180 degree phase regions. A second "structure mask" is used to expose selected parts of the underlying photoresist that were unexposed due to the existence of the phase shift mask chrome in the first mask.

Another technique is disclosed in U.S. Pat. No. 5,573,890 to Spence utilizing a single mask method in which transition regions are used to compensate for artifacts that would have been produced if there were 0 degree to 180 degree transitions in the mask. Spence also discloses a two-mask, two-exposure approach where a first "phase shift and structure mask" consisting of adjacent 0 degree and 180 degree phase regions is used to create dark unexposed areas on the underlying photoresist. A second "trim mask" is then used to erase artifacts produced by the first mask.

A recent variation to the alternating phase shift method contemplates use of four different phases of light, i.e. use of regions causing a 0 degree phase shift, 60 degree phase shift, 120 degree phase shift, and 180 degree phase shift so that artifacts are not produced after the first exposure. Although this type of alternating phase shift technique uses a single mask and a single exposure, the need for four different phase regions makes this type of alternating phase shift mask extremely expensive to manufacture.

Another recent attempt to overcome the limitations of the binary mask in patterning small feature sizes is the "attenuated phase shift mask." FIG. 1B shows an attenuated phase shift mask 142. Regions 144 and 148 are made of a transparent material such as quartz. Transparent regions 144 and 148 have equal thickness and induce no phase shift in the light passing through them. Region 146 is made of a nearly opaque material such as MoSiON (Molybdenum Silicon Oxynitride) which transmits only 6% of the light shone thereon. The thickness and index of refraction value of the nearly opaque material in region 146 is such that it induces a phase shift of 180 degrees in the light passing through it. The destructive interference caused by light passing through the 0 degree phase shift regions 144 and 148 and light passing through the 180 degree phase shift region 146 results in a relatively dark area on a photoresist layer lying below mask 142.

However, because there is only a 6% transmission of the phase shifted light, the interference effect is reduced since only 6% of the phase shifted light performs destructive interference with light passing through the 0 phase shift regions. Thus, the image rendered on an underlying photoresist layer is not very sharp. Referring to graph 160 in FIG. 1B, it is noted that the difference between the intensity of light in relatively dark area 156 and the peak intensities at points 154 and 152 is not as great as the corresponding difference between the intensity of light in dark area 116 and the peak intensities at points 114 and 112 shown in graph 120 of FIG. 1A.

Another disadvantage of attenuated phase shift mask 142 is that an additional layer of a nearly opaque material such as MoSiON must be patterned and fabricated on attenuated phase shift mask 142 which results in added complications and expense of manufacturing the mask.

Accordingly, there is need in the art for a photolithographic mask to render a sharp image of minimum feature sizes with a balanced intensity of light and further to reduce the complexity and expense of manufacturing the photolithographic mask. There is also need in the art for a mask which can be utilized in a single exposure mode to reduce the complexity and expense of producing the desired exposure pattern on an underlying photoresist layer.

SUMMARY OF THE INVENTION

The present invention is a transparent phase shift mask for fabrication of small feature sizes. The invention overcomes the need in the art for a photolithographic mask for rendering sharp images of smallest feature sizes with a balanced intensity of light. The invention's resolution enhancement phase shift mask can be manufactured by using a simple process which results in a reduction in the complexity and expense of manufacturing photolithographic masks. Moreover, the invention can be used in a single mask, single exposure mode to reduce the complexity and expense of producing a desired exposure pattern on the underlying photoresist layer while increasing the throughput of the semiconductor wafer fabrication process.

In one embodiment, the invention comprises a mask having a transparent substrate. The transparent substrate has a first clear region, a second clear region and a third clear region, and an opaque film is situated over at least a portion of the transparent substrate to define an opaque region. The transparent substrate can be formed of quartz or calcium fluoride, for example. The second and third clear regions have equal thicknesses. However, the first clear region has a thickness different from each of the second and third clear regions. The difference in thickness between the first clear region and the second and third clear regions is calculated to cause a 180 degree phase shift in light passing through the first clear region relative to a phase of light passing through each of the second and third clear regions. The destructive interference caused at the phase boundaries of the first clear region and the second and third clear regions results in a dark unexposed area on the surface of an underlying photoresist layer; the dark unexposed area having geometry and dimensions corresponding to the geometry and dimensions of the first clear region.

In this embodiment of the invention, a single mask, single exposure technique is used. The single mask comprises regions such as the first, second, and third clear regions referred to above for producing a desired image of small feature sizes on an underlying photoresist layer. For large features, an opaque film which can be formed of chrome, for example, is used in the invention's mask.

DETAILED DESCRIPTION OF THE INVENTION

The present invention is a transparent phase shift mask for fabrication of small feature sizes. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 2:
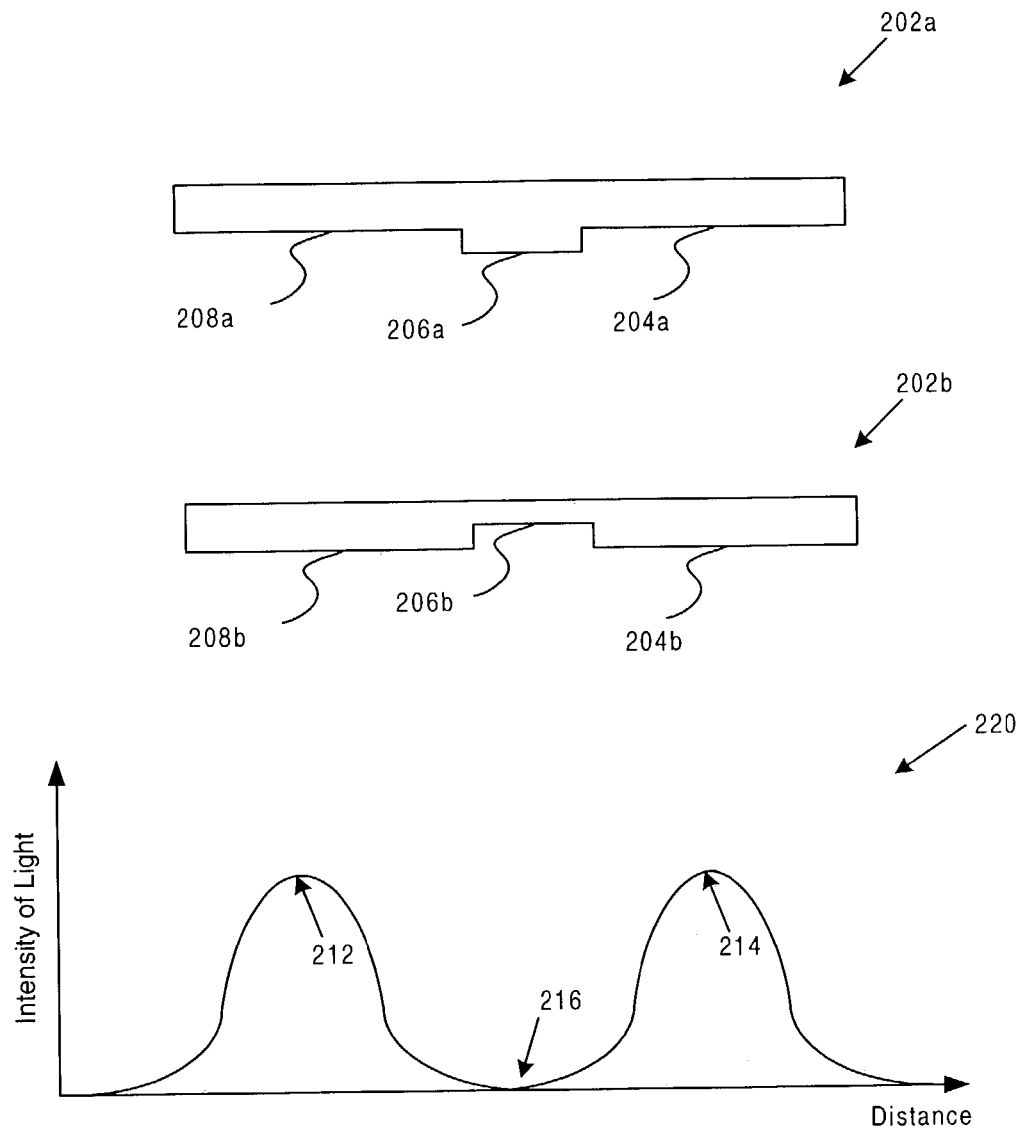
FIG. 2 shows exemplary embodiments of the invention's phase shift mask and a graph of intensity of light corresponding to the exemplary embodiments of the invention's phase shift mask.

With respect to the specific embodiments of the invention described in the present application, reference is made to FIG. 2. One embodiment of the resolution enhancement phase shift mask of the present invention is referenced generally by numeral 202a. Another embodiment of the resolution enhancement phase shift mask of the present invention is referenced generally by numeral 202b. Referring first to mask 202a, clear region 206a which is made of transparent material, such as quartz or CaF (calcium fluoride), is flanked by two contiguous clear regions 204a and 208a which are also made of transparent material, such as quartz or CaF. As seen from FIG. 2, clear region 206a is thicker than clear regions 204a and 208a. The thicknesses of clear regions 204a and 208a and clear region 206a are calculated so that there is a 180 degree phase difference between light passing through clear region 206a relative to light passing through clear regions 204a and 208a. For example, the thicknesses of clear regions 204a and 208a may be calculated to cause a 180 degree phase shift in light passing through them, while the thickness of clear region 206a may be calculated such that clear region 206a does not cause any phase shift in light passing through it. In other words, clear region 206a results in a 0 degree phase shift in light passing through it. Accordingly, there is a 180 degree phase difference between light passing through clear region 206a relative to light passing through clear regions 204a and 208a. In the present application, regions such as clear region 206a are also referred to as "non-phase shift" regions and regions such as clear regions 204a and 208a are also referred to as "phase shift" regions.

Referring to mask 202b corresponding to another embodiment of the resolution enhancement phase shift mask of the present invention, clear region 206b which is made of transparent material, such as quartz or CaF, is flanked by two contiguous clear regions 204b and 208b which are also made of transparent material. In mask 202b, clear regions 204b and 208b are thicker than clear region 206b, and the thicknesses of clear regions 204b and 208b are calculated such that clear regions 204b and 208b do not cause any phase shift in light passing through them, while the thickness of clear region 206b may be calculated to cause a 180 degree phase shift in light passing through it. In this particular arrangement, clear regions 204b and 208b function as "non-phase shift" regions, and clear region 206b functions as a "phase shift" region. This particular embodiment also results in a 180 degree phase difference between light passing through clear region 206b relative to light passing through clear regions 204b and 208b.

Because of this 180 degree phase difference, there is destructive interference at the phase boundaries of clear regions 204a and 208a and clear region 206a in mask 202a, and at the phase boundaries of clear regions 204b and 208b and clear region 206b in mask 202b. As shown in graph 220 of FIG. 2, the destructive interference at the phase boundaries of clear regions 204a and 208a with clear region 206a and at the phase boundaries of clear regions 204b and 208b with clear region 206b results in a dark area 216 directly below each clear region 206a and 206b. As shown in graph 220, the intensity of light in dark area 216 is low while the intensity of light in the areas directly below each of clear regions 208a and 204a and clear regions 208b and 204b peaks at points 212 and 214.

Figure 3:
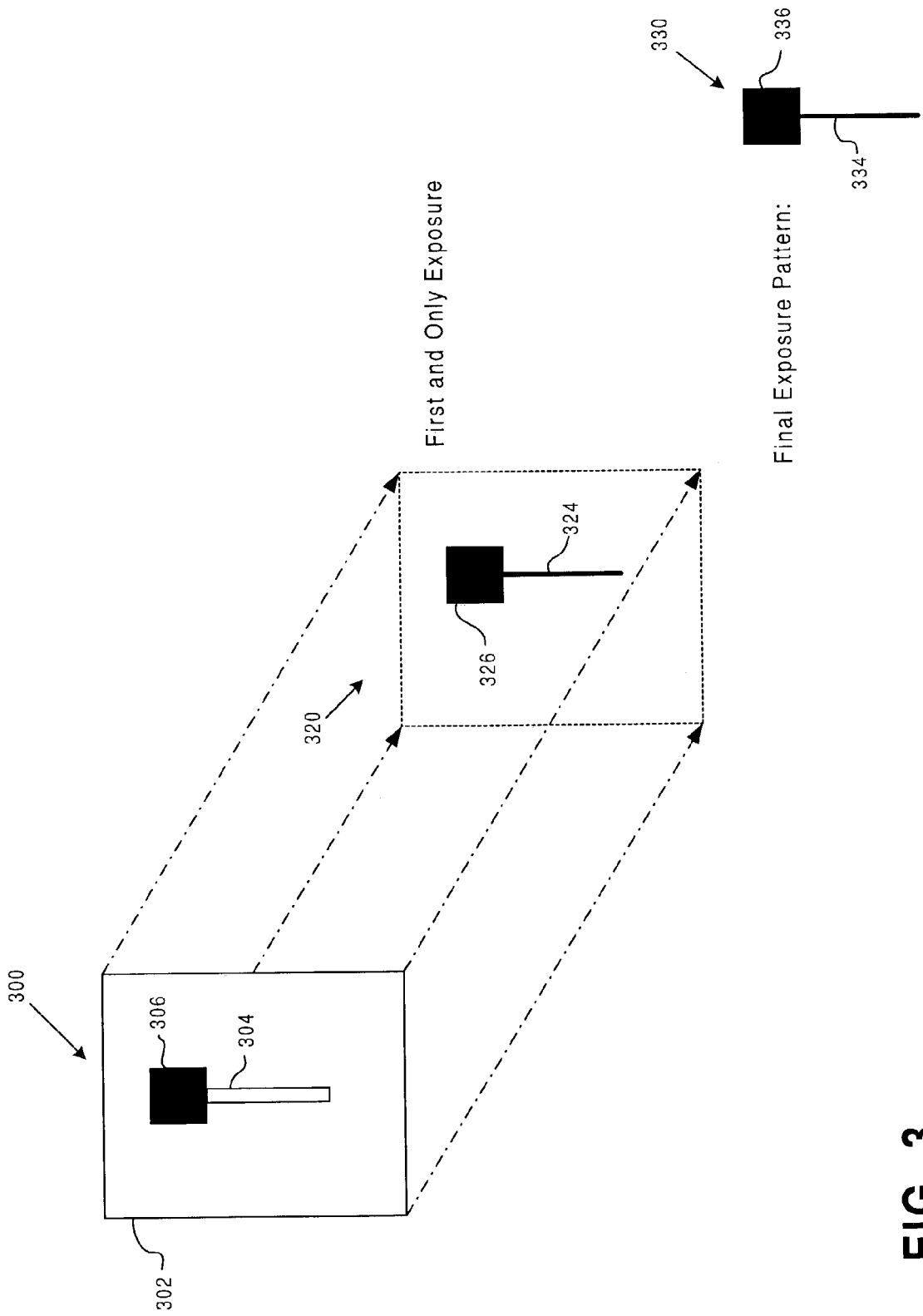
FIG. 3 shows an embodiment of the invention's single mask, single exposure technique and the resulting final exposure pattern.

As explained above, the present invention is used primarily to produce images for patterning smallest feature sizes in a semiconductor fabrication process which are typically transistor gates. By way of example, FIG. 3 illustrates an embodiment of the invention's resolution enhancement phase shift mask used for producing a desired exposure pattern on an underlying photoresist layer. In this example, the desired exposure pattern corresponds to a transistor gate of minimum width connected to a contact landing pad.

The invention's mask 300 in FIG. 3 is used to produce a dark line of minimum width and a relatively wide dark square on the surface of an underlying photoresist layer. The dark line of minimum width would ultimately be fabricated as a transistor gate of minimum width while the relatively wide dark square would ultimately be fabricated as a contact landing pad connected to the minimum width transistor gate. Thus, the final semiconductor structure would be a minimum width transistor gate connected to a relatively wide and square contact landing pad.

Discussing the invention's phase shift mask 300 in more detail, region 302 of mask 300 is a clear region of transparent material (having a 100% light transmission rate), such as quartz or CaF, for example. Similarly, region 304 of mask 300 is a clear region of transparent material (also having a 100% light transmission rate), such as quartz or CaF. Region 306 comprises fully opaque material such as chrome which has a light transmission rate of 0%. The depths of regions 302 and 304 are calculated such that there is a 180 degree phase shift in light passing through region 302 relative to light passing through region 304. In one embodiment, region 302 is etched down so as to induce a 180 degree phase shift in light passing through it. By way of example, if region 302 is quartz, region 302 is etched down to a depth of approximately 2280 Angstroms so that region 304 is approximately 2280 Angstroms thicker than region 302. In addition to the type of material used for clear regions 302 and 304, the depth for etching region 302 is also calculated based on the wavelength of light used during the photolithographic process. In this particular embodiment, region 304 does not cause any phase shift in light passing through it, and thus, there is a 180 degree phase shift in light passing through region 302 relative to light passing through region 304.

In another embodiment, region 304 is etched down to a depth so as to induce a 180 degree phase shift in light passing through it while region 302 does not cause any phase shift in light passing through it. This particular embodiment also yields a 180 degree phase shift in light passing through region 302 relative to light passing through region 304.

Image 320 in FIG. 3 is the image rendered on the surface of an underlying photoresist layer when light passes through mask 300. Image 320 comprises a dark line 324 which has a width equal to the minimum width for a transistor gate and equal to the smallest feature size in the semiconductor fabrication process used in this example. The width of dark line 324 in image 320 is, for example, 0.15 microns. In the manner explained above, dark line 324 in image 320 has geometry and dimensions that correspond to the geometry and dimensions of region 304 in mask 300. Ultimately, a wafer region will be fabricated having geometry and dimensions that correspond to the geometry and dimensions of region 304 in mask 300.

Image 320 also comprises a dark square 326 which is connected to dark line 324. Final exposure pattern 330 is the pattern that would be the final resulting photoresist pattern. Final exposure pattern 330 comprises thin line 334 of minimum width corresponding to a transistor gate of minimum width, which in the present example is 0.15 microns. Final exposure pattern 330 also includes square contact region 336 which is connected to thin line 334.

It is noted that according to the embodiment of the invention's resolution enhancement phase shift mask 300 in FIG. 3, the invention's mask is used to pattern the underlying photoresist layer in a single exposure. Destructive interference of light at phase boundaries between regions 302 and 304 of phase shift mask 300 results in creation of a dark unexposed line 324 on the photoresist layer. Since it is desired that the width of line 324 be very small, for example 0.15 microns, it is not possible to achieve such a small width using conventional techniques such as those using a chrome pattern to block light. However, dark square region 326 is wide enough to be created using conventional techniques by using opaque region 306 in mask 300.

Thus, resolution enhancement phase shift mask 300 of the present invention combines the conventional binary mask technique of using chrome to create wider unexposed areas with the invention's unique phase shift technique utilizing thick and thin transparent regions to create thin unexposed areas on an underlying photoresist layer. The combination of binary mask technique and the invention's unique phase shift technique thus creates a final exposure pattern having both wide areas and areas of minimum width. It is again noted that in the embodiment of the invention described in this example, a single exposure is required to arrive at the final exposure pattern on the photoresist layer, i.e. final exposure pattern 330 comprising dark square 336 and minimum width line 334.

Figure 4:
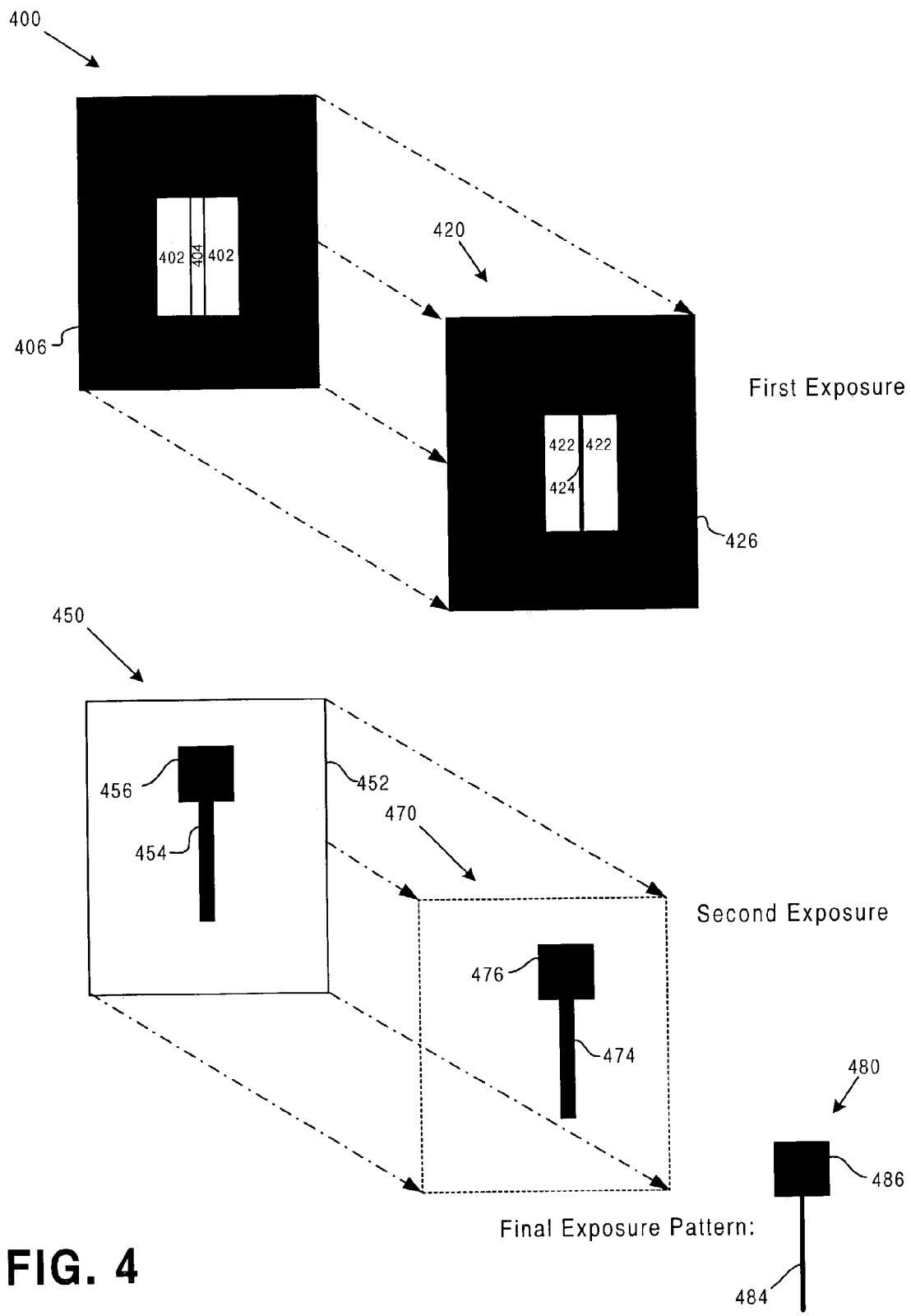
FIG. 4 shows an embodiment of the invention's two-mask, two-exposure technique and the resulting final exposure pattern.

In another embodiment of the invention, the invention's phase shift technique is used to arrive at a final exposure pattern using a two-mask, two-exposure technique (as opposed to the single exposure embodiment described above). FIG. 4 illustrates the two-mask embodiment of the invention. At the outset it is noted that final exposure pattern 480 in FIG. 4 which is the result of the two-exposure embodiment of the invention is the same as final exposure pattern 330 in FIG. 3 which was the result of the single exposure embodiment of the present invention.

Referring to FIG. 4, regions 402 of mask 400 are clear regions of transparent material (having a 100% light transmission rate), such as quartz or CaF, for example. Similarly, region 404 of mask 400 is a clear region of transparent material (also having a 100% light transmission rate), such as quartz or CaF. Region 406 comprises a fully opaque material such as chrome which has a light transmission rate of 0%. The depths of regions 402 and region 404 are calculated such that there is a 180 degree phase shift in light passing through regions 402 relative to light passing through region 404. In one embodiment, where each of regions 402 and 404 is quartz, regions 402 are etched down to a depth of approximately 2280 Angstroms so as to induce a 180 degree phase shift in the light passing through them. Region 404, which is approximately 2280 Angstroms thicker than regions 402, does not cause any phase shift in the light passing through it.

In another embodiment, region 402 is etched down to a depth so as to induce a 180 degree phase shift in the light passing through it while regions 402 do not cause any phase shift in light passing through them. This particular embodiment also yields a 180 degree phase shift in light passing through regions 402 relative to light passing through region 404.

Image 420 in FIG. 4 is the image rendered on the surface of an underlying photoresist layer when light passes through phase shift mask 400. Image 420 is comprised of a dark thin line 424 which has a width equal to the minimum width for a transistor gate and equal to the smallest feature size in the semiconductor fabrication process used in this example. The width of dark line 424 in image 420 is, for example, 0.15 microns. Image 420 also includes areas 422 which are completely exposed to light passing through mask 400. Image 420 further includes area 426 which is dark and not exposed to light due to presence of opaque region 406 in mask 400.

As seen from image 426 in FIG. 4, mask 400 results in an exposure pattern having thin line 424 which corresponds to the transistor gate to be ultimately fabricated on the silicon wafer. However, image 426 does not include the exposure pattern corresponding to the contact to be fabricated. The exposure pattern for the contact pad is achieved by performing an exposure using mask 450 in FIG. 4. Mask 450 comprises region 452 which is a clear region of transparent material, such as quartz or CaF, for example, and which induces no phase shift in the light passing through it. Regions 454 and 456 comprise a fully opaque material such as chrome which has a light transmission rate of 0%.

Image 470 in FIG. 4 is the image rendered on the surface of the underlying photoresist layer when light passes through mask 450. Image 470 is comprised of a dark rectangular area 474 and a dark square area 476 which are not exposed to light due to presence of opaque regions 454 and 456 in mask 450. Final exposure pattern 480 is the result of the two exposures through masks 400 and 450. As seen in final exposure pattern 480, the only unexposed areas of the photoresist layer are thin line 484 and square 486. All other areas of the photoresist layer have been exposed by either the first or the second exposures using, respectively, masks 400 and 450.

In other words, during the first exposure using mask 400, region 426 and thin line 424 were not exposed to light while regions 422 were exposed to light. During the second exposure using mask 450, opaque region 454 ensures that line 424 which was unexposed during the first exposure would remain unexposed. However, with the exception of line 424 which had not been exposed to light, the remaining areas under opaque region 454 have already been exposed to light during the first exposure using mask 400. During the second exposure using mask 450, square opaque region 456 prevents exposure of the underlying photoresist corresponding to square area 486 in final exposure pattern 480.

As stated above, the resulting exposure pattern after the dual exposure using masks 400 and 450 is final exposure pattern 480. Final exposure pattern 480 includes dark square area 486 which is contiguous to dark line 484. Final exposure pattern 480 is the pattern that would be the final resulting photoresist pattern. Final exposure pattern 480 comprises a thin line 484 of minimum width corresponding to a transistor gate of minimum width, which in the present example is 0.15 microns. Final exposure pattern 480 also includes square contact region 486 which is connected to thin line 484.

It is noted that according to this embodiment of the invention, destructive interference of light at phase boundaries between regions 402 and 404 of mask 400 results in creation of a dark unexposed line 484 on the photoresist layer. Since it is desired that the width of line 484 be very small, for example 0.15 microns, it is not possible to achieve such a small width using conventional techniques such as using chrome on quartz. However, dark square region 486 is wide enough to be created using conventional techniques by using opaque region 456 in mask 450. Thus, resolution enhancement phase shift mask of the present invention combines the conventional binary mask technique of using an opaque layer to create wider unexposed areas with the invention's unique phase shift technique utilizing thick and thin transparent regions to create thin unexposed areas on an underlying photoresist layer. The combination of binary mask technique and the invention's unique phase shift technique thus creates a final exposure pattern having both wide areas and areas of minimum width. It is noted that in the embodiment of the invention described above, a dual exposure is required to arrive at the final exposure pattern of the photoresist layer, i.e. final exposure pattern 480 comprising square 486 and minimum width line 484.

Figure 5A:
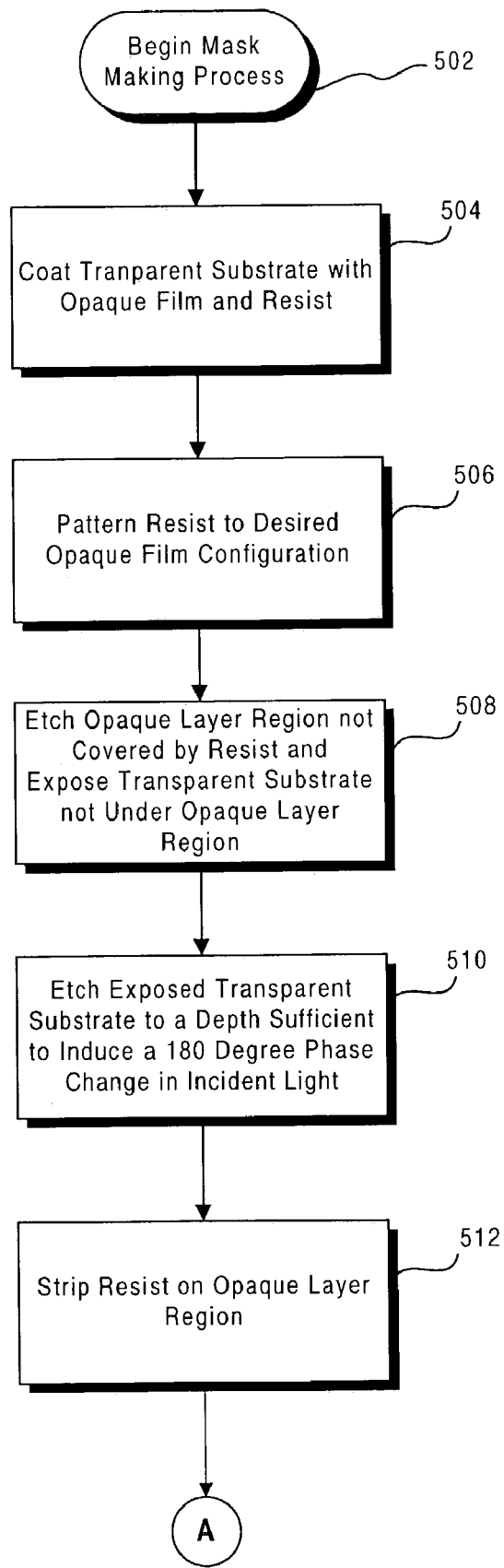
FIGS. 5A and 5B are flow charts illustrating a process for making the invention's mask according to one embodiment.
Figure 5B:
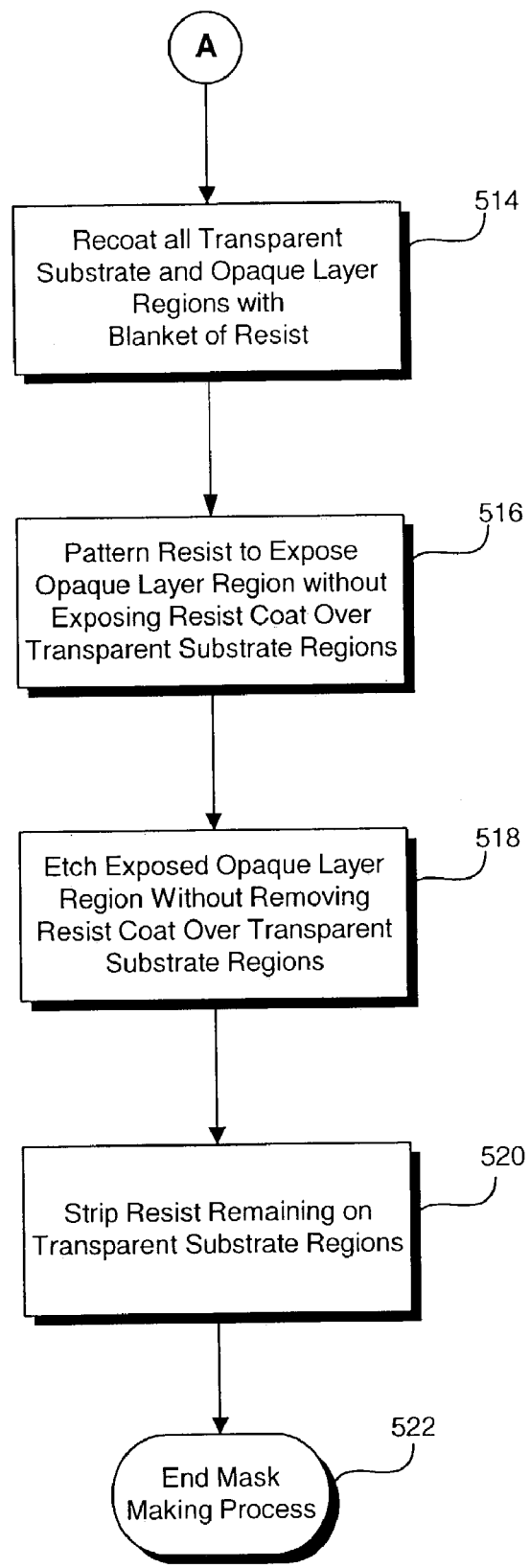
Figure 6A:
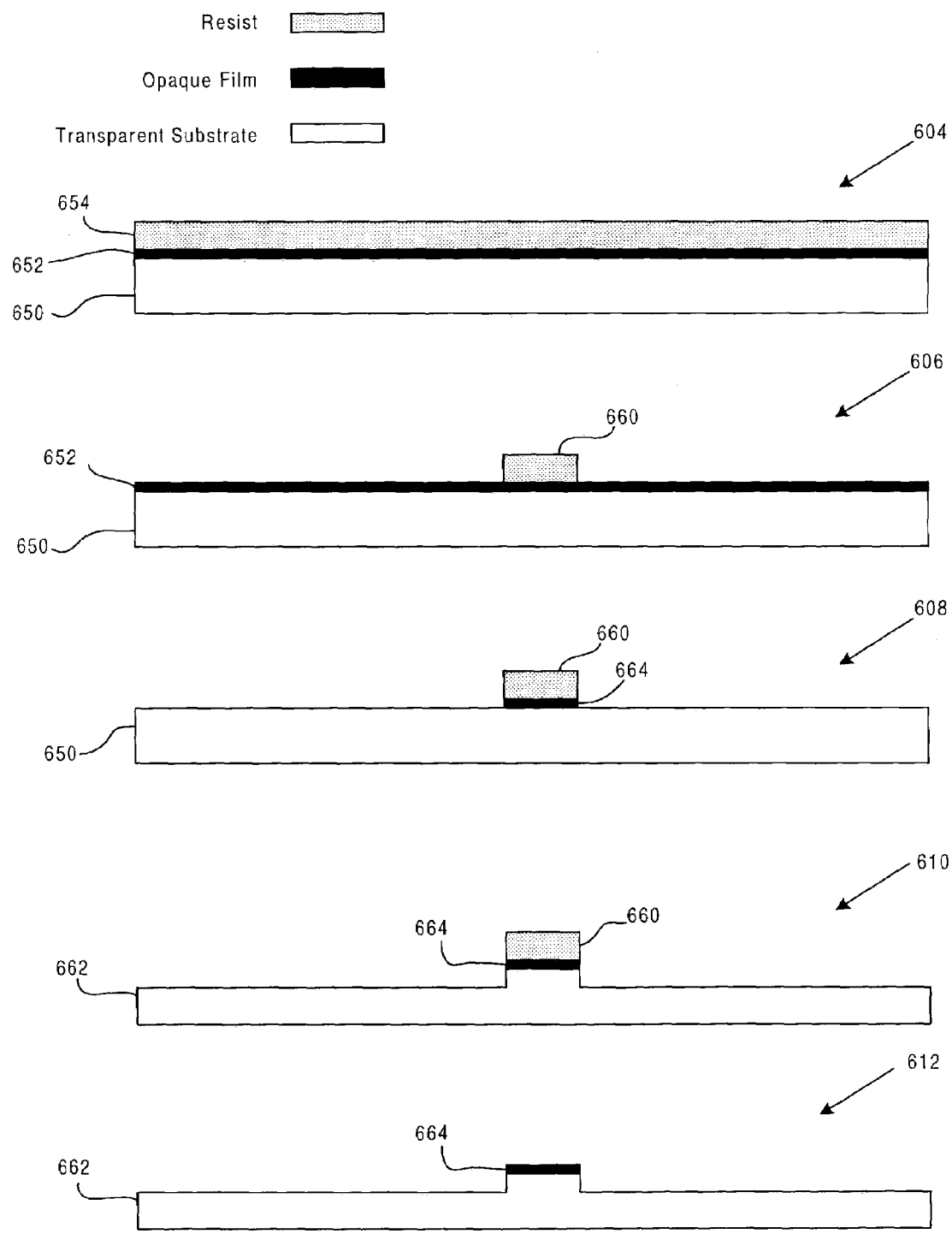
FIGS. 6A and 6B illustrate the resulting structure after the performance of each step in the flow charts of FIGS. 5A and 5B.
Figure 6B:
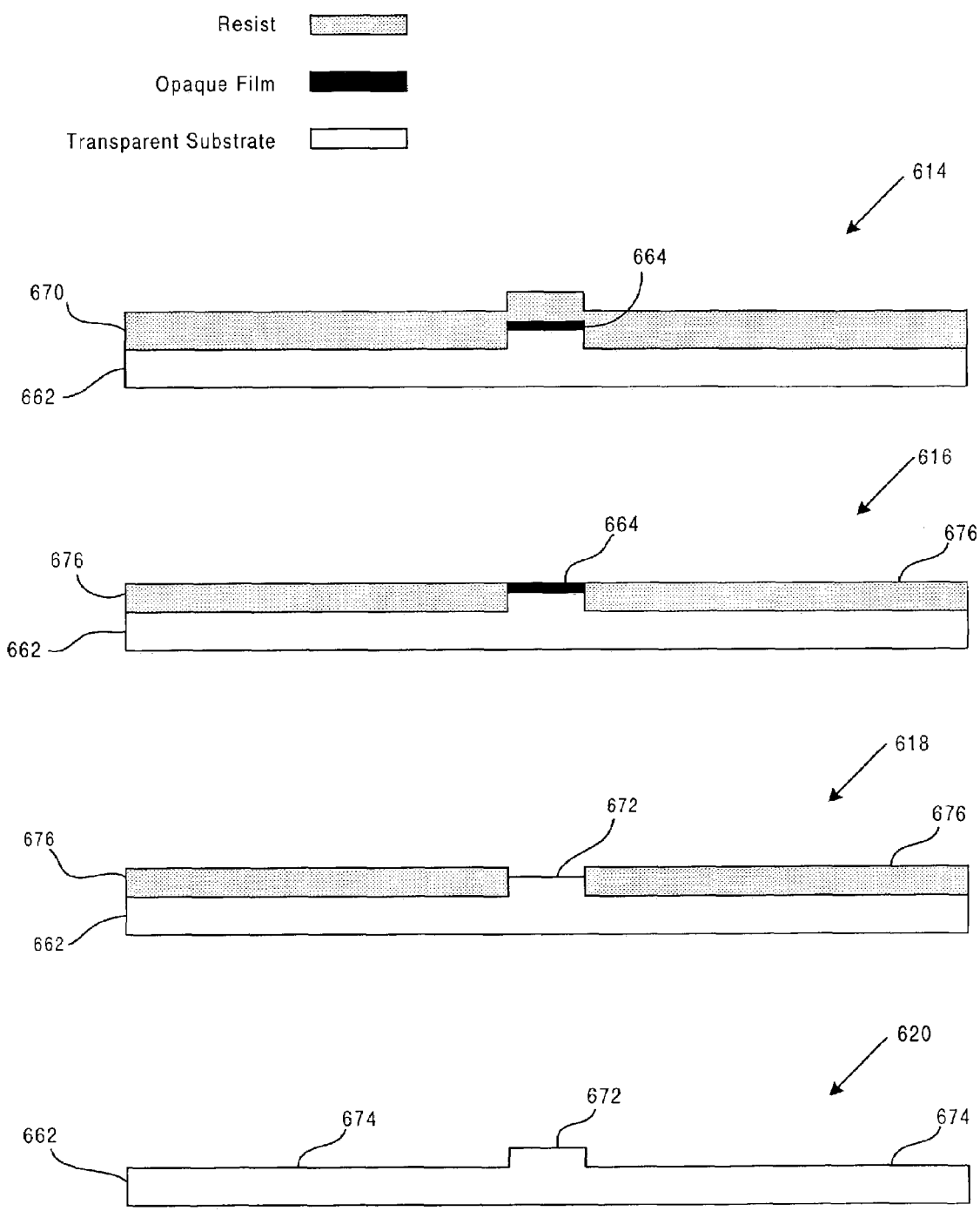

The flow charts in FIGS. 5A and 5B illustrate the invention's process for making the resolution enhancement phase shift mask according to one embodiment. Referring to FIG. 5A, the process of making the invention's phase shift mask begins at step 502. At step 504, a transparent substrate of uniform thickness, such as quartz or CaF, is coated with an opaque film of uniform thickness, such as a layer of chrome, which is in turn coated with a layer of photoresist of uniform thickness (it is noted that "photoresist" is also referred to as "resist" in the present application). FIGS. 6A and 6B illustrate the structure resulting from each respective step of the flow charts in FIGS. 5A and 5B. Referring to FIG. 6A, structure 604 is the resulting structure after step 504. As shown in FIG. 6A, structure 604 comprises transparent substrate 650 covered by a layer of opaque film 652 and a layer of photoresist 654.

At step 506 (FIG. 5A) the photoresist layer is exposed, developed, and removed from the opaque layer except from those regions where the opaque layer is to remain. The resulting structure 606 (FIG. 6A) shows photoresist region 660 covering opaque layer 652 which in turn covers transparent substrate 650. At step 508 (FIG. 5A), with the exception of the opaque region covered by the photoresist, the remaining regions of the opaque layer are etched away. The resulting structure 608 (FIG. 6A) comprises photoresist region 660 over opaque layer region 664. Transparent substrate 650 remains intact; however, with the exception of transparent substrate 650 region covered by opaque layer region 664 and photoresist region 660, other regions of transparent substrate 650 will be exposed to subsequent etching. In the particular embodiment shown in FIG. 6A, regions such as photoresist region 660 and opaque layer region 664 in structure 608 are also referred to as regions "designating" the 0 degree phase shift regions in transparent substrate 650.

At step 510 (FIG. 5A), those regions of the transparent substrate that are not protected by the remaining photoresist region are etched to a depth sufficient to produce a 180 degree phase shift in light passing therethrough. As stated above, for a quartz transparent substrate, the depth sufficient for producing the 180 degree phase shift is approximately 2280 Angstroms. Structure 610 in FIG. 6A is the resulting structure after step 510. As shown in structure 610, transparent substrate 662 is etched everywhere except for the transparent substrate region covered by photoresist region 660 and opaque layer region 664. As stated above, the region of transparent substrate 662 that is etched, i.e. the region that is not protected by photoresist region 660 and opaque layer region 664, will induce a phase shift of 180 degrees in light passing through it.

At step 512 (FIG. 5A), the photoresist remaining on the opaque layer region is stripped. Structure 612 in FIG. 6A is the result of this step. As shown in structure 612, only opaque layer region 664 remains over transparent substrate 662. At step 514 (FIG. 5B), the entire transparent substrate and the opaque layer region remaining on the transparent substrate are covered with a blanket of photoresist. Structure 614 in FIG. 6B is the resulting structure after step 514. As shown in structure 614, the entire transparent substrate 662 and opaque layer region 664 are covered by photoresist layer 670. At step 516 (FIG. 5B), the photoresist region covering the opaque layer region is exposed and developed while other regions of the photoresist remain intact. Structure 616 in FIG. 6B is the result of this step. As shown in structure 616, opaque layer region 664 is exposed while photoresist regions 676 cover transparent substrate 662.

At step 518 (FIG. 5B), the exposed opaque layer region is etched away without etching the photoresist regions covering the transparent substrate. The result of this step is shown as structure 618 in FIG. 6B. As shown in structure 618, transparent substrate 662 is covered by photoresist regions 676. In the particular embodiment where transparent substrate 862 comprises quartz, transparent substrate region 672 has a thickness that is about 2280 Angstroms greater than the thickness of the remaining regions of transparent substrate 662. At step 520 (FIG. 5B), the photoresist remaining on the transparent substrate is stripped. Structure 620 (FIG. 6B) is the resulting structure after completion of step 520. Structure 620 comprises transparent substrate 662 having thin transparent substrate regions 674 and thick transparent substrate region 672. As stated above, thin transparent substrate regions 674 induce a 180 degree phase shift in light passing therethrough relative to thick transparent substrate region 672. At step 522 (FIG. 5B), the process of making a phase shift mask according to the present invention ends. Structure 620 is therefore the final photolithographic mask that is used to pattern photoresist on the surface of a semiconductor wafer.

Figure 7A:
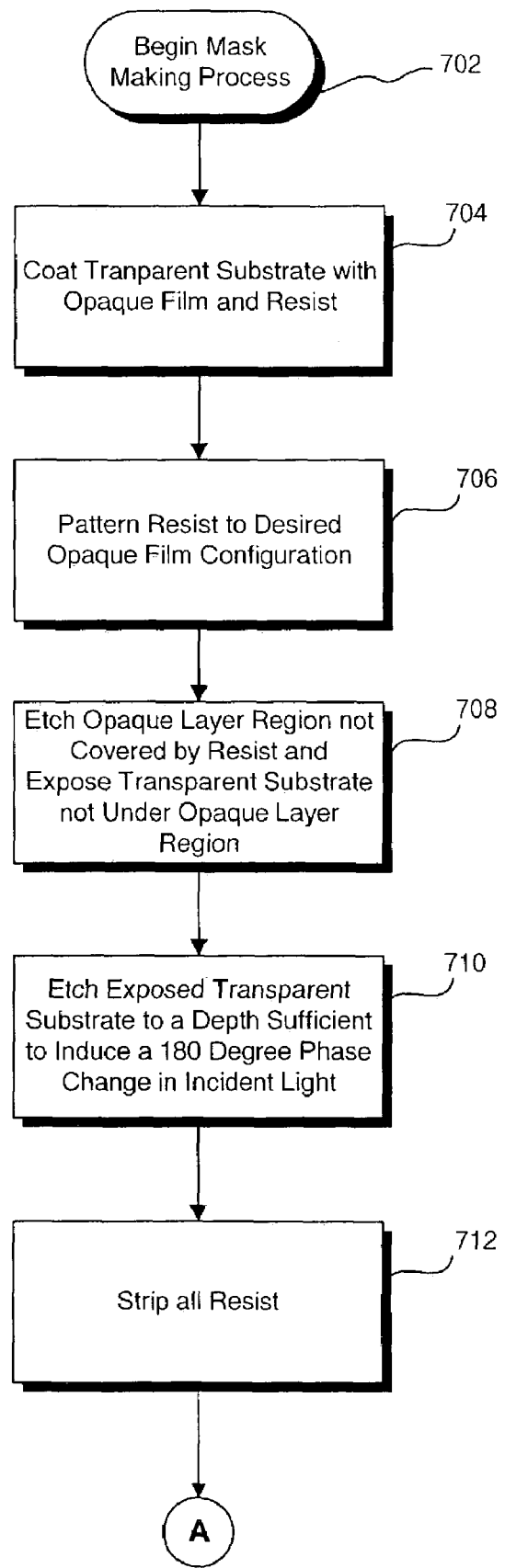
FIGS. 7A and 7B are flow charts illustrating a process for making the invention's mask according to another embodiment.
Figure 7B:
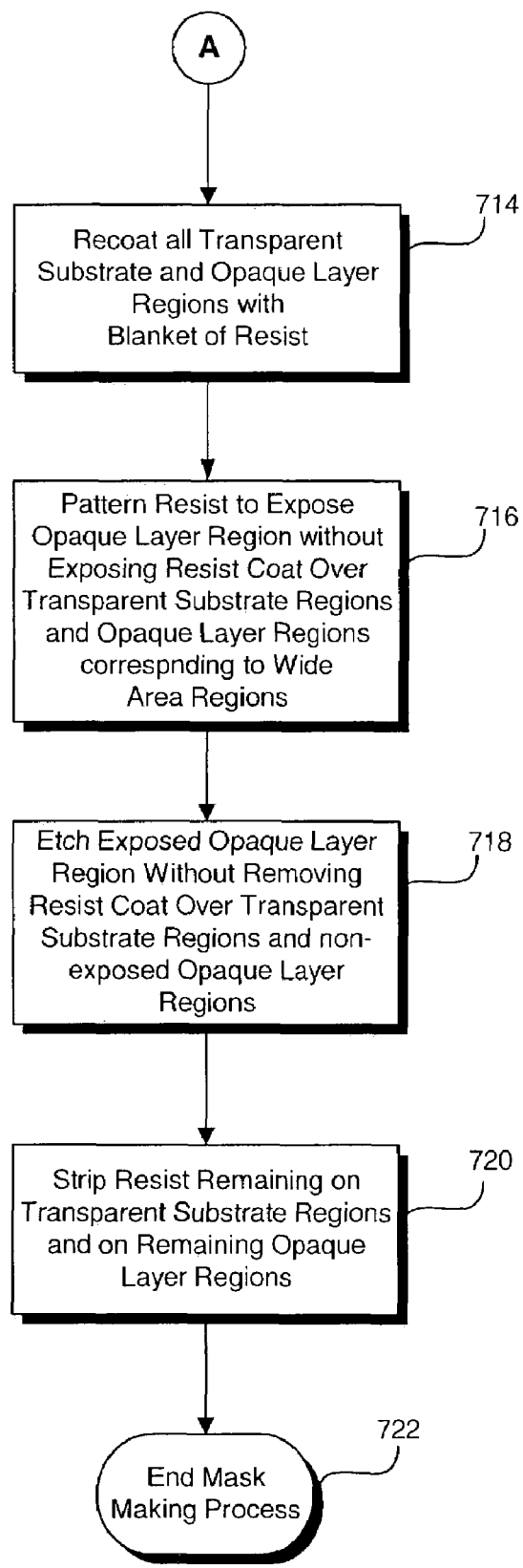
Figure 8A:
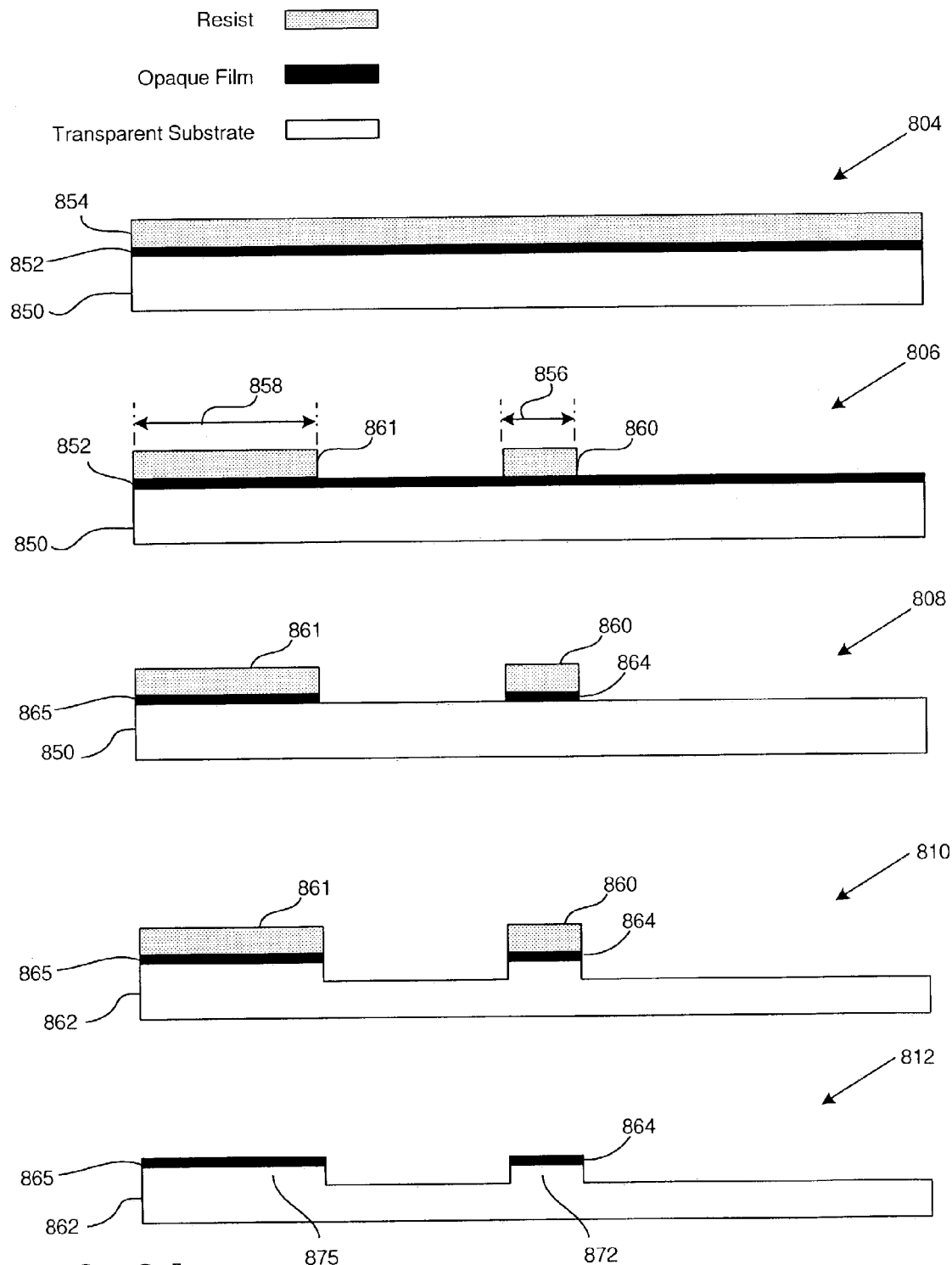
FIGS. 8A and 8B illustrate the resulting structure after the performance of each step in the flow charts of FIGS. 7A and 7B.
Figure 8B:
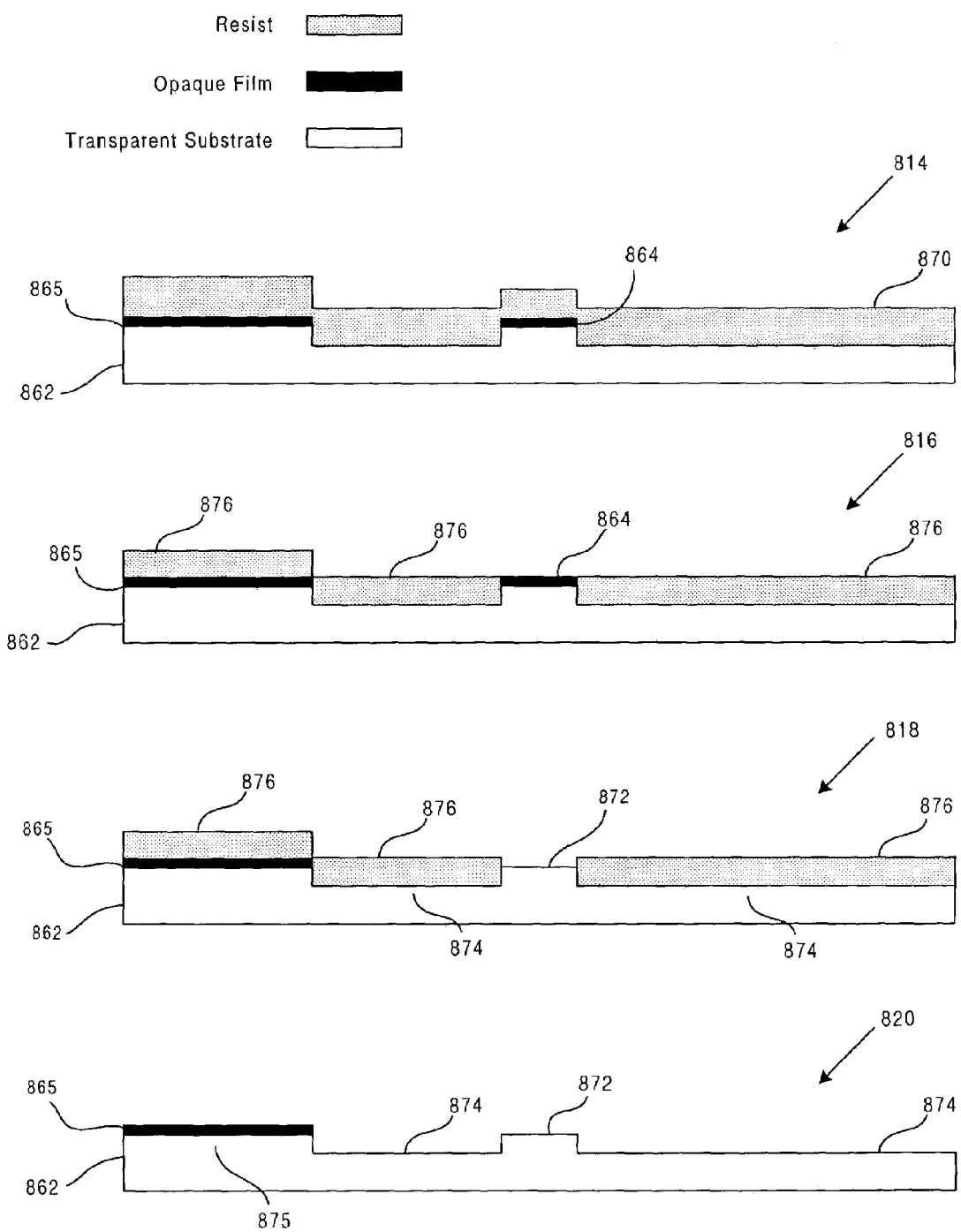

Referring now to FIGS. 7A and 7B, the flow charts in FIGS. 7A and 7B illustrate the invention's process for making the resolution enhancement phase shift mask according to another embodiment. Referring to FIG. 7A, the process of making the invention's phase shift mask begins at step 702. At step 704, a transparent substrate of uniform thickness, such as quartz or CaF, is coated with an opaque film of uniform thickness, such as a layer of chrome, which is in turn coated with a layer of photoresist of uniform thickness. FIGS. 8A and 8B illustrate the structure resulting from each respective step of the flow charts in FIGS. 7A and 7B. Referring to FIG. 8A, structure 804 is the resulting structure after step 704. As shown in FIG. 8A, structure 804 comprises transparent substrate 850 covered by a layer of opaque film 852 and a layer of photoresist 854.

At step 706 (FIG. 7A) the photoresist layer is exposed, developed, and removed from the opaque layer except from those regions where the opaque layer is to remain. The resulting structure 806 (FIG. 8A) shows photoresist regions 860 and 861 covering opaque layer 852 which in turn covers transparent substrate 850. As shown in FIG. 8A, photoresist region 860 has width 856, and photoresist region 861 has width 858. In this particular embodiment, width 856 corresponds to a region of the final photolithographic mask (corresponding to mask 820 of FIG. 8B) for creating thin areas, e.g., minimum widths, on an underlying photoresist layer using the unique phase shift technique of the invention. In contrast, width 858 corresponds to a region of the final photolithographic mask for creating wide areas using the conventional technique of using an opaque film layer over transparent substrate 850.

At step 708 (FIG. 7A), with the exception of the opaque regions covered by the photoresist, the remaining regions of the opaque layer are etched away. The resulting structure 808 (FIG. 8A) comprises photoresist region 860 over opaque layer region 864 and photoresist region 861 over opaque layer region 865. Transparent substrate 850 remains intact; however, with the exception of transparent substrate 850 region covered by opaque layer region 864 and photoresist region 860 and opaque layer region 865 and by photoresist region 861, other regions of transparent substrate 850 will be exposed to subsequent etching. In the particular embodiment shown in FIG. 8A, photoresist region 860 and opaque layer region 864 in structure 808 correspond to the region designating the 0 degree phase shift region in transparent substrate 850.

At step 710 (FIG. 7A), those regions of the transparent substrate that are not protected by the remaining photoresist region are etched to a depth sufficient to produce a 180 degree phase shift in light passing therethrough. As stated above, for a quartz transparent substrate, the depth sufficient for producing the 180 degree phase shift is approximately 2280 Angstroms. Structure 810 in FIG. 8A is the resulting structure after step 710. As shown in structure 810, transparent substrate 862 is etched everywhere except for the transparent substrate region covered by photoresist region 860 and opaque layer region 864 and by photoresist region 861 and opaque layer region 865. As stated above, the region of transparent substrate 862 that is etched, i.e. the region that is not protected by photoresist region 860 and opaque layer region 864 and by photoresist region 861 and opaque layer region 865, will induce a phase shift of 180 degrees in light passing through it.

At step 712 (FIG. 7A), all remaining photoresist is stripped. Structure 812 in FIG. 8A is the result of this step. As shown in structure 812, opaque layer regions 864 and 865 remain over respective transparent substrate regions 872 and 875 while all photoresist is stripped. At step 714 (FIG. 7B), the entire transparent substrate and the opaque layer region remaining on the transparent substrate are covered with a blanket of photoresist. Structure 814 in FIG. 8B is the resulting structure after step 714. As shown in structure 814, entire transparent substrate 862 and opaque layer regions 864 and 865 are covered by photoresist layer 870. At step 716 (FIG. 7B), the photoresist region covering the opaque layer region that corresponds to the 0 degree phase shift region in the transparent substrate is exposed and developed while other regions of the photoresist remain intact. Structure 816 in FIG. 8B is the result of this step. As shown in structure 816, opaque layer region 864 is exposed while photoresist regions 876 cover transparent substrate 862 and opaque layer region 865. As discussed above, opaque layer region 865 corresponds to the region of the final photolithographic mask for creating wide areas.

At step 718 (FIG. 7B), the exposed opaque layer region is etched away without etching the photoresist regions covering the transparent substrate and the photoresist region covering the non-exposed opaque layer region. The result of this step is shown as structure 818 in FIG. 8B. As shown in structure 818, transparent substrate regions 874 and opaque layer region 865 are covered by photoresist regions 876, and transparent substrate region 872 is exposed. In the particular embodiment where transparent substrate 862 comprises quartz, transparent substrate region 872 has a thickness that is about 2280 Angstroms greater than the thickness of transparent substrate regions 874. At step 720 (FIG. 7B), the photoresist remaining on the transparent substrate and on the remaining opaque layer region is stripped. Structure 820 (FIG. 8B) is the resulting structure after completion of step 720. Structure 820 comprises transparent substrate 862 having thin transparent substrate regions 874 and thick transparent substrate region 872. Structure 820 further comprises opaque layer region 865 over transparent substrate region 875. As stated above, thin transparent substrate regions 874 induce a 180 degree phase shift in light passing therethrough relative to thick transparent substrate region 872 for achieving thin features and minimum dimensions according to the unique phase shift technique of the invention. Furthermore, structure 820 further comprises opaque layer region 865 for blocking light and achieving wide dimensions according to conventional techniques.

At step 722 (FIG. 7B), the process of making a phase shift mask according to the present invention ends. Structure 820 is therefore the final photolithographic mask that is used to pattern photoresist on the surface of a semiconductor wafer employing both the unique phase shift technique of the invention in conjunction with conventional techniques, and thus, structure 820 is suitable for use with single mask single exposure implementations.

Figure 9A:
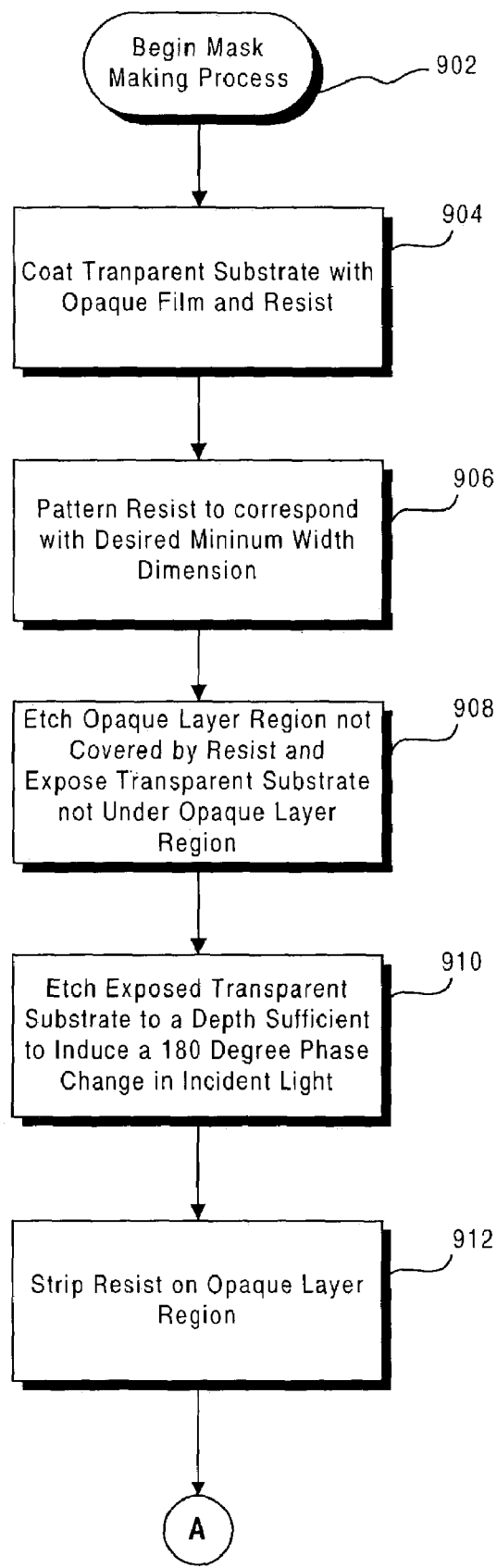
FIGS. 9A and 9B are flow charts illustrating a process for making the invention's mask according to another embodiment.
Figure 9B:
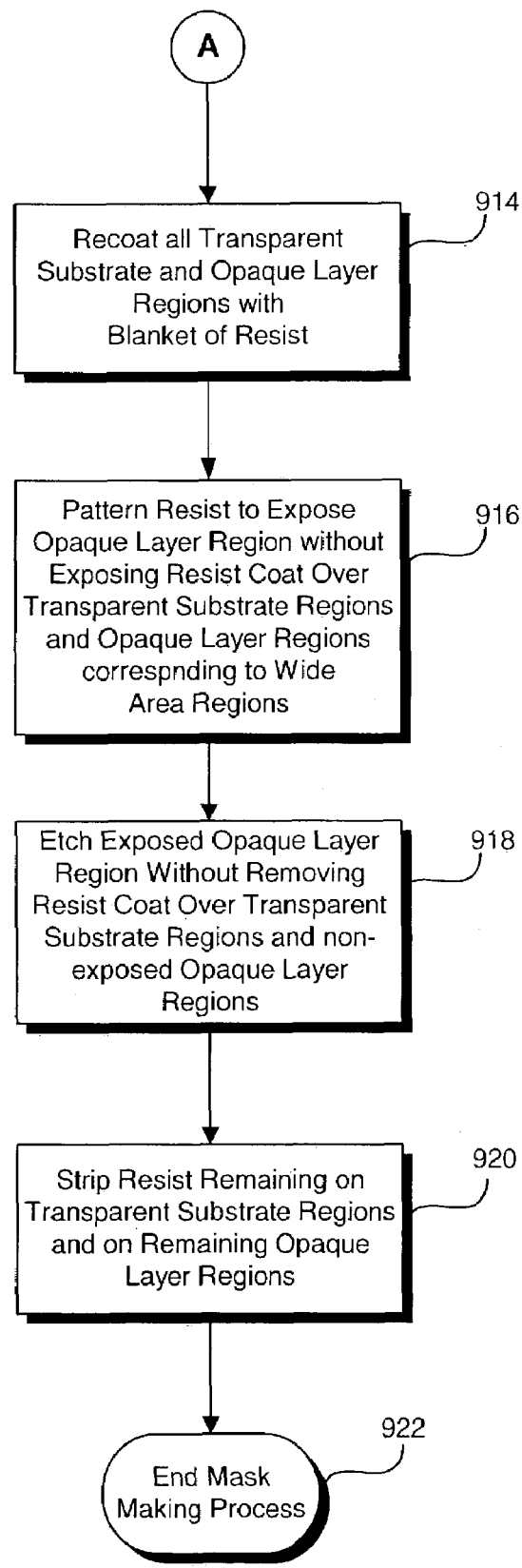
Figure 10A:
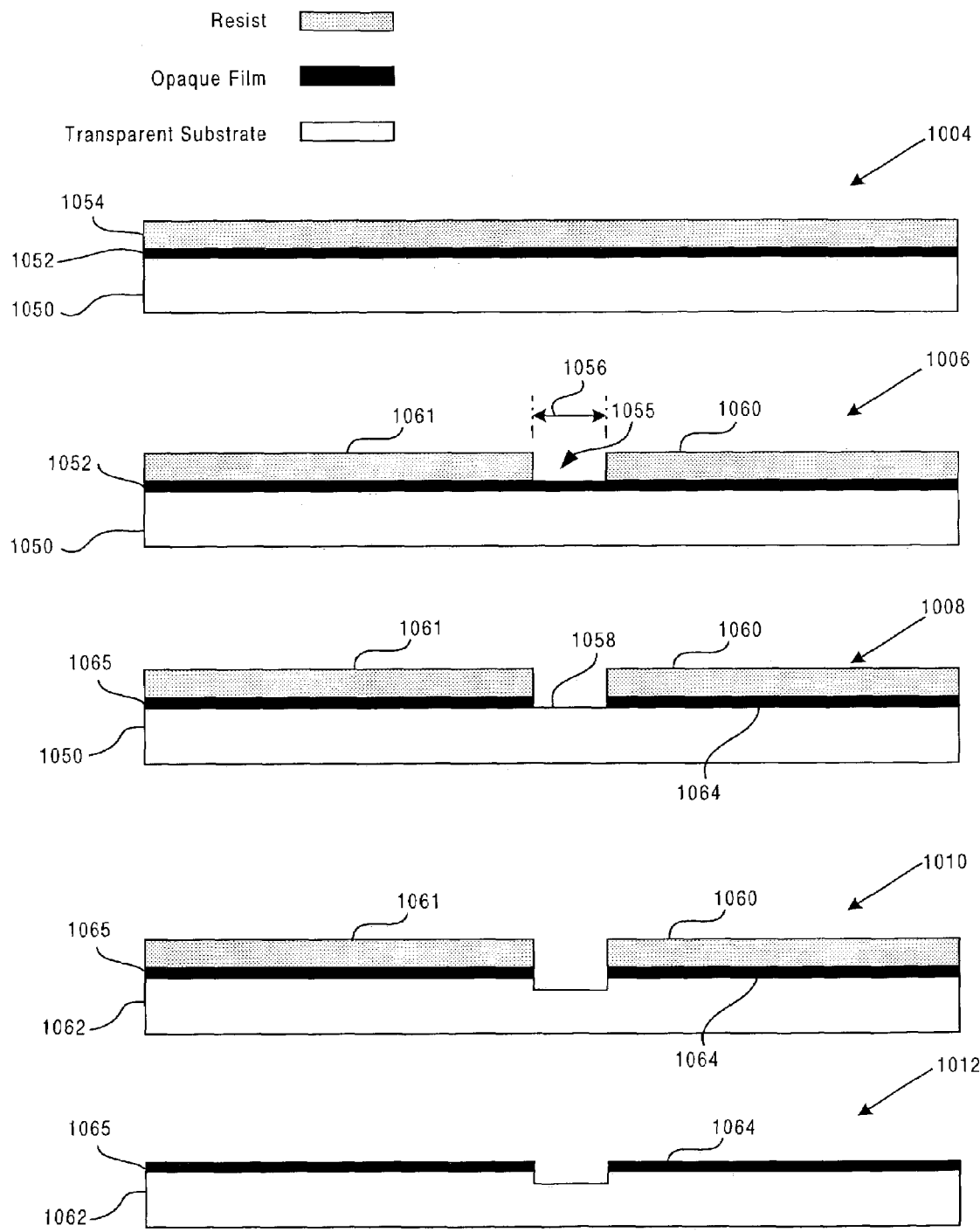
FIGS. 10A and 10B illustrate the resulting structure after the performance of each step in the flow charts of FIGS. 9A and 9B.
Figure 10B:
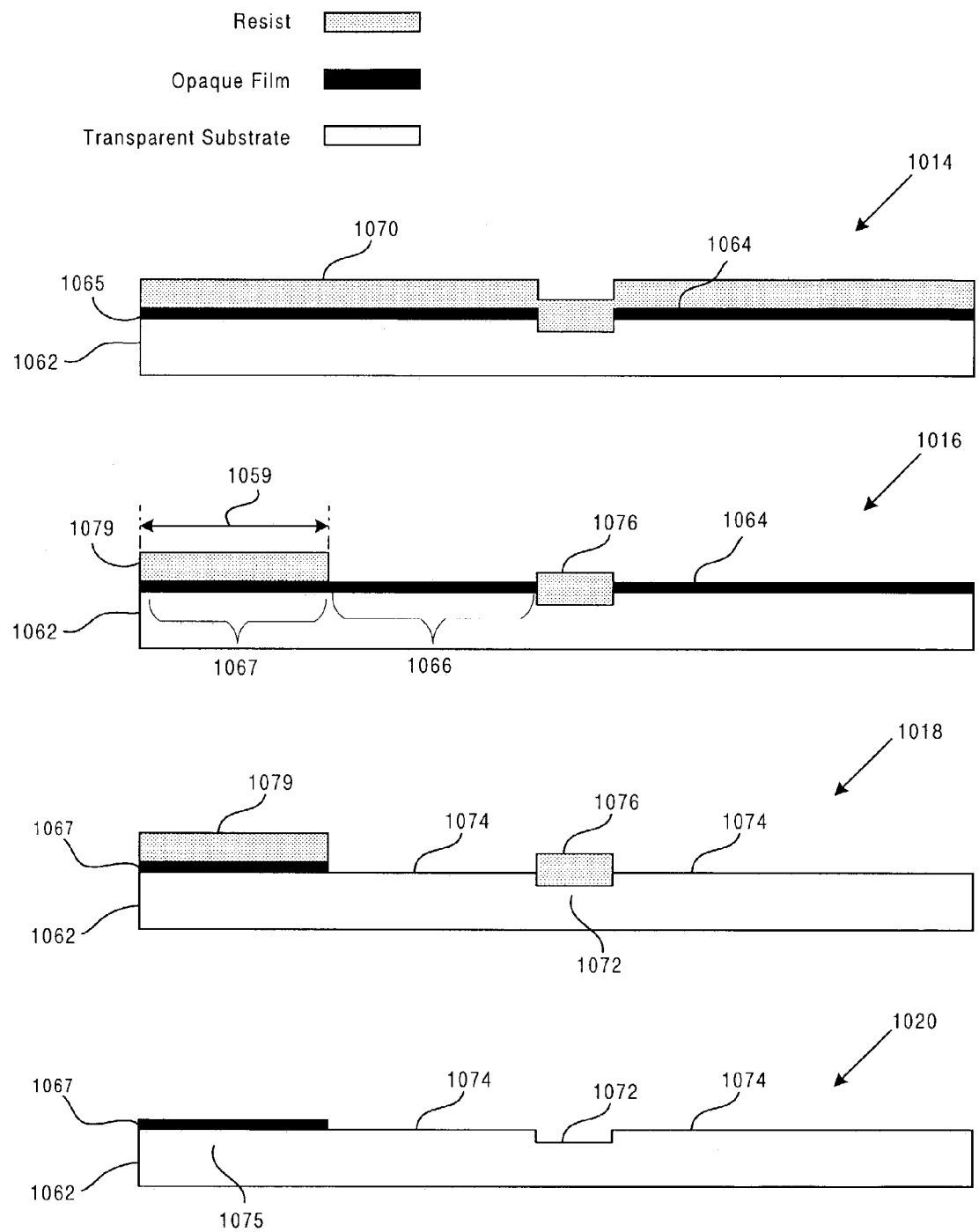

Referring now to FIGS. 9A and 9B, the flow charts in FIGS. 9A and 9B illustrate the invention's process for making the resolution enhancement phase shift mask according to another embodiment. Referring to FIG. 9A, the process of making the invention's phase shift mask begins at step 902. At step 904, a transparent substrate of uniform thickness, such as quartz or CaF, is coated with an opaque film of uniform thickness, such as a layer of chrome, which is in turn coated with a layer of photoresist of uniform thickness. FIGS. 10A and 10B illustrate the structure resulting from each respective step of the flow charts in FIGS. 9A and 9B. Referring to FIG. 10A, structure 1004 is the resulting structure after step 904. As shown in FIG. 10A, structure 1004 comprises transparent substrate 1050 covered by a layer of opaque film 1052 and a layer of photoresist 1054.

At step 906 (FIG. 9A) the photoresist layer corresponding to a region for creating thin areas, e.g., minimum widths, is exposed, developed, and removed from the opaque layer. The resulting structure 1006 (FIG. 10A) shows gap region 1055 defined between photoresist regions 1060 and 1061; photoresist regions 1060 and 1061 cover opaque layer 1052 which in turn covers transparent substrate 1050. As shown in FIG. 10A, gap region 1055 has width 1056. In this particular embodiment, width 1056 corresponds to a region of the final photolithographic mask (corresponding to mask 1020 of FIG. 10B) for creating thin areas, e.g., minimum dimensions, on an underlying photoresist layer using the unique phase shift technique of the invention.

At step 908 (FIG. 9A), with the exception of the opaque regions covered by the photoresist, the remaining region of the opaque layer are etched away. The resulting structure 1008 (FIG. 10A) comprises photoresist region 1060 over opaque layer region 1064 and photoresist region 1061 over opaque layer region 1065. Transparent substrate 1050 remains intact; however, exposed region 1058 of substrate 1050 defined between photoresist region 1060 over opaque layer region 1064 and photoresist region 1061 over opaque layer region 1065 will be exposed to subsequent etching. In the particular embodiment shown in FIG. 10A, exposed region 1058 corresponds to the 180 degree phase shift region in the final photolithographic mask.

At step 910 (FIG. 9A), those regions of the transparent substrate that are not protected by the remaining photoresist region are etched to a depth sufficient to produce a 180 degree phase shift in light passing therethrough. As stated above, for a quartz transparent substrate, the depth sufficient for producing the 180 degree phase shift is approximately 2280 Angstroms. Structure 1010 in FIG. 10A is the resulting structure after step 910. As shown in structure 1010, transparent substrate 1062 is etched everywhere except for the transparent substrate region covered by photoresist region 1060 and opaque layer region 1064 and by photoresist region 1061 and opaque layer region 1065. As stated above, the region of transparent substrate 1062 that is etched, i.e. the region that is not protected by photoresist region 1060 and opaque layer region 1064 and by photoresist region 1061 and opaque layer region 1065, will induce a phase shift of 180 degrees in light passing through it.

At step 912 (FIG. 9A), the photoresist remaining on the opaque layer region is stripped. Structure 1012 in FIG. 10A is the result of this step. As shown in structure 1012, opaque layer regions 1064 and 1065 remain over transparent substrate 1062. At step 914 (FIG. 9B), the entire transparent substrate and the opaque layer regions remaining on the transparent substrate are covered with a blanket of photoresist. Structure 1014 in FIG. 10B is the resulting structure after step 914. As shown in structure 1014, entire transparent substrate 1062 and opaque layer regions 1064 and 1065 are covered by photoresist layer 1070.

At step 916 (FIG. 9B), the photoresist region covering the opaque layer region that corresponds the 0 degree phase shift region in the transparent substrate is exposed and developed while other regions of the photoresist remain intact. Structure 1016 in FIG. 10B is the result of this step. As shown in structure 1016, opaque layer regions 1064 and 1066 are exposed while photoresist regions 1076 and 1079 cover transparent substrate 1062 and opaque layer region 1067, respectively. In this particular embodiment, photoresist region 1079 has width 1059 corresponding to the region of the final photolithographic mask for creating wide areas.

At step 918 (FIG. 9B), the exposed opaque layer region is etched away without etching the photoresist regions covering the transparent substrate and the photoresist covering the non-exposed opaque layer region. The result of this step is shown as structure 1018 in FIG. 10B. As shown in structure 1018, transparent substrate region 1072 and opaque layer region 1067 are covered by photoresist regions 1076 and 1079, respectively, and transparent substrate regions 1074 are exposed. In the particular embodiment where transparent substrate 1062 comprises quartz, each transparent substrate regions 1074 has a thickness that is about 2280 Angstroms greater than the thickness of transparent substrate region 1072. At step 920 (FIG. 9B), the photoresist remaining on the transparent substrate and on the remaining opaque layer region is stripped. Structure 1020 (FIG. 10B) is the resulting structure after completion of step 920. Structure 1020 comprises transparent substrate 1062 having thin transparent substrate region 1072 and thick transparent substrate regions 1074. Structure 1020 further comprises opaque layer region 1067 over transparent substrate region 1075. As stated above, thin transparent substrate region 1072 induces a 180 degree phase shift in light passing therethrough relative to thick transparent substrate regions 1074 for achieving thin features and minimum dimensions according to the unique phase shift technique of the invention. Furthermore, structure 1020 further comprises opaque layer region 1067 for blocking light and achieving wide dimensions according to conventional techniques.

At step 922 (FIG. 9B), the process of making a phase shift mask according to the present invention ends. Structure 1020 is therefore the final photolithographic mask that is used to pattern photoresist on the surface of a semiconductor wafer employing both the unique phase shift technique of the invention in conjunction with conventional techniques, and thus, structure 1020 is suitable for use with single mask single exposure implementations.

Figure 1A:
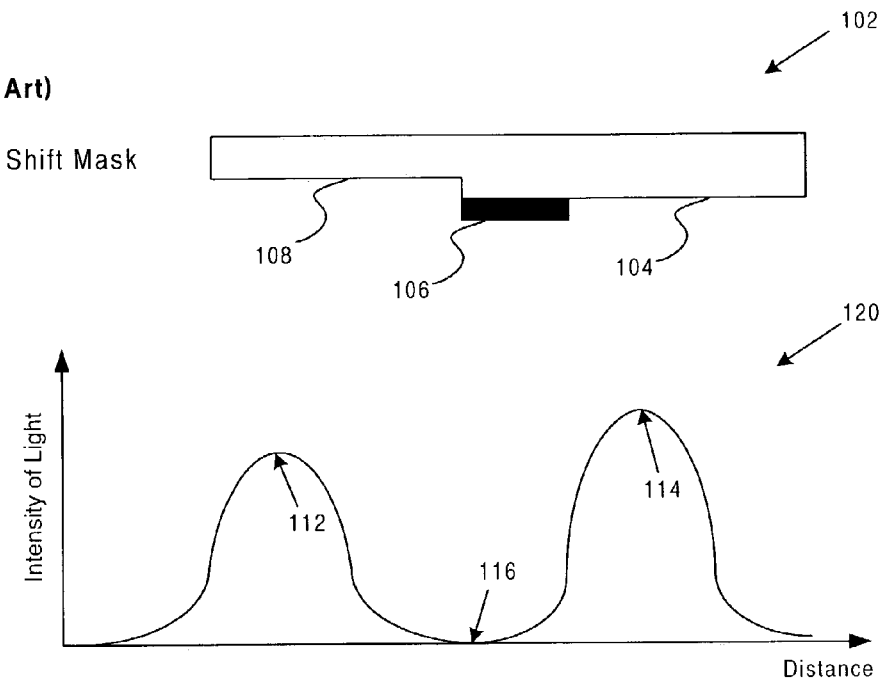
FIG. 1A shows a prior art alternating phase shift mask and a graph of intensity of light corresponding to the alternating phase shift mask.
Figure 1B:
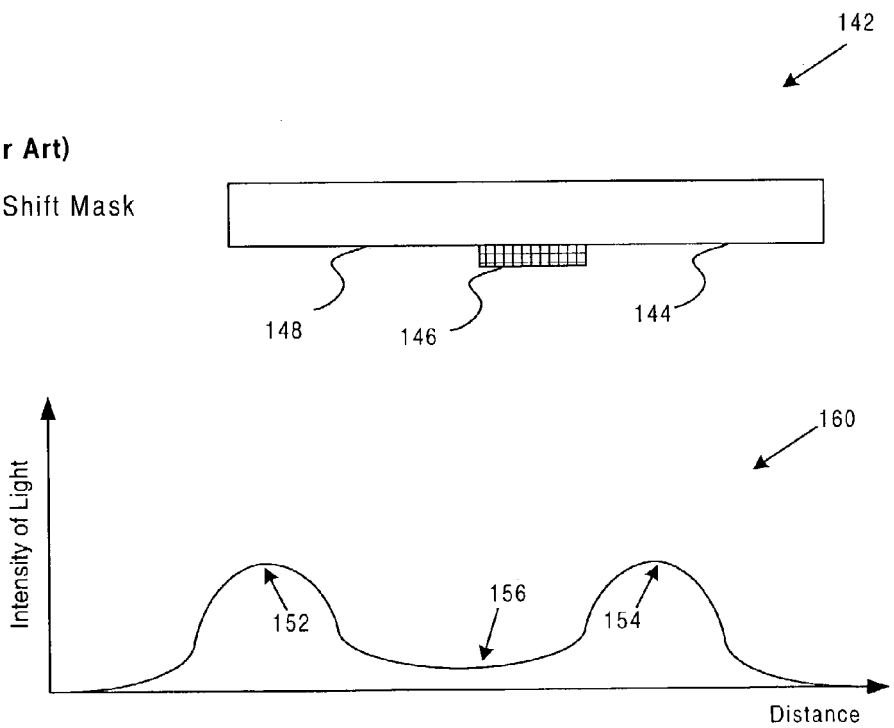
FIG. 1B shows a prior art attenuated phase shift mask and a graph of intensity of light corresponding to the attenuated phase shift mask.

The invention's resolution enhancement phase shift mask described above presents several advantages over the conventional phase shift masks such as the attenuated phase shift mask shown in FIG. 1B and the alternating phase shift mask shown in FIG. 1A. With respect to the attenuated phase shift mask shown in FIG. 1B, the invention has a number of advantages. For example, one of the advantages of the invention's phase shift mask over the attenuated phase shift mask of FIG. 1B is that the invention results in improved sidewall angles when patterning photoresist on the surface of the semiconductor wafer. Sidewall angle is a measure of the steepness of the angle formed between an unexposed area and an adjacent exposed area of the photoresist.

The invention's phase shift mask achieves an improved sidewall angle since the image rendered by the invention's phase shift mask on the surface of the photoresist is much sharper compared to the image rendered by a conventional attenuated phase shift mask. Comparing graph 160 in FIG. 1B with graph 220 in FIG. 2, it is apparent that the difference between the intensity of light in relatively dark area 156 and the peak intensities at points 154 and 152 in graph 160 is not as great as the corresponding difference between the intensity of light in dark area 216 and the peak intensities at points 214 and 212 shown in graph 220 of FIG. 2. The greater difference between peak intensity and low intensity points in the image produced by the invention's phase shift mask means that the image produced by the invention's phase shift mask is sharper than that produced by the conventional attenuated phase shift mask. The sharper image in turn results in an improved sidewall angle.

Figure 11:
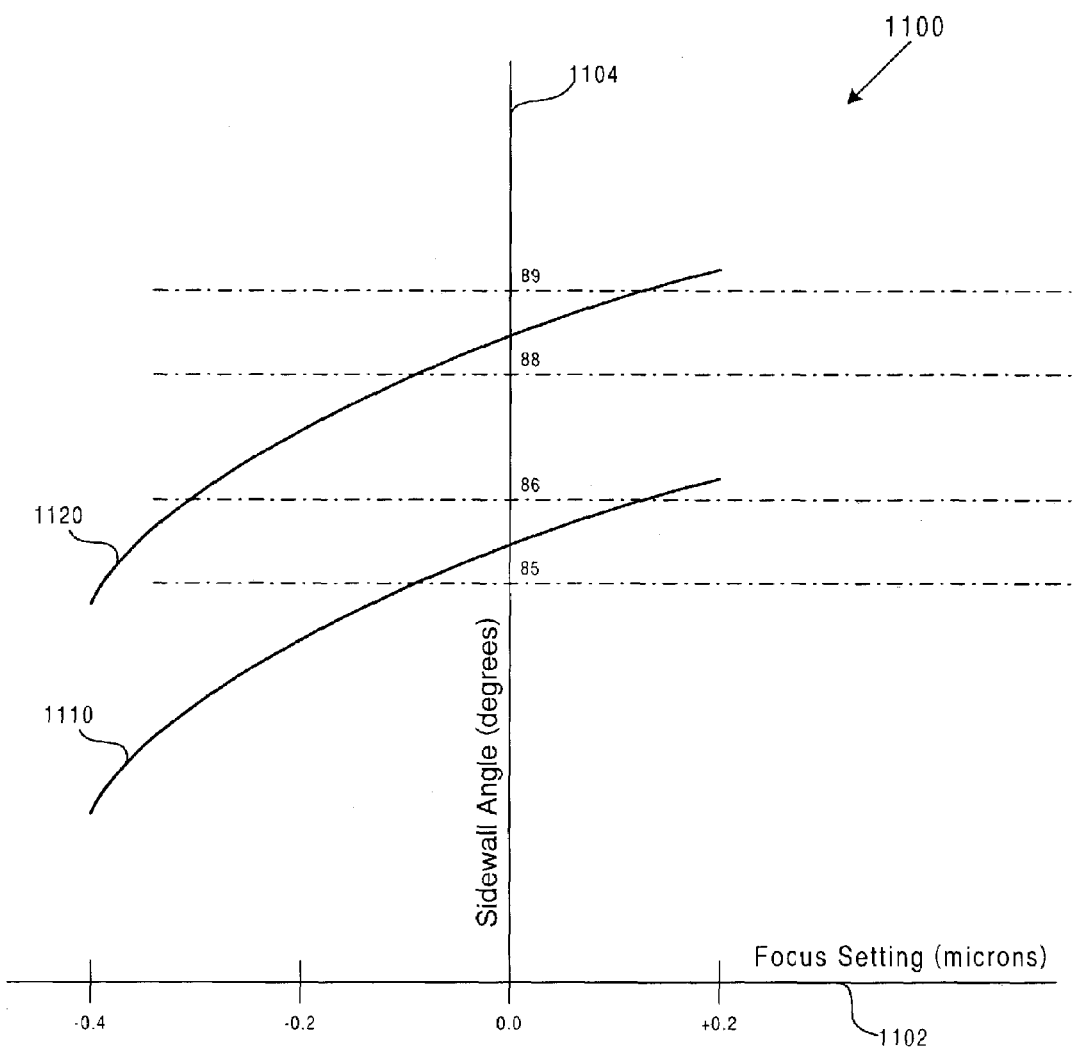
FIG. 11 is a graph comparing the photoresist pattern sidewall angle when the invention's mask is used with the photoresist pattern sidewall angle when an attenuated phase shift mask is used.

Graph 1100 in FIG. 11 shows the difference in sidewall angles achieved by the invention's phase shift mask compared to that achieved by a conventional attenuated phase shift mask such as that shown in FIG. 1B. In graph 1100, x-axis 1102 corresponds to various focus settings and y-axis 1104 corresponds to the resulting sidewall angles. Curve 1120 represents the sidewall angles achieved by the invention's phase shift mask at various focus settings while curve 1110 represents the sidewall angles achieved by a conventional attenuated phase shift mask. As seen from graph 1100, the invention achieves higher sidewall angles at all focus settings compared with the sidewall angles achieved by a conventional attenuated phase shift mask. For example, at the focus setting of 0.0 microns, the sidewall angle achieved by the invention is approximately 88.5 degrees compared to approximately 85.5 degrees achieved by a conventional attenuated phase shift mask.

Another advance achieved by the invention compared to attenuated phase shift mask 142 of FIG. 1B is a significant reduction in photoresist loss. One measure of an effective photolithographic mask is the amount of photoresist loss when producing a photoresist pattern. As the image produced by the mask increases in sharpness, i.e. as the difference between the intensity of light in dark (unexposed) areas and the intensity of light in bright (exposed) areas on the photoresist layer increases, the photoresist areas to be etched out and those areas to remain unetched will be more clearly defined. As the boundary between exposed and unexposed areas on the photoresist layer becomes more clearly defined, the "rounding off" of the photoresist at the boundary of exposed and unexposed areas is reduced. In other words, there is less photoresist loss due to the rounding off effect.

The adverse effects of photoresist loss are more damaging and noticeable when the photoresist layer is very thin. Thinner photoresist layers are desirable as smallest feature sizes to be fabricated on the semiconductor wafer decrease. Thinner layers of photoresist result in a higher resolution of photoresist pattern which can be used to fabricate smaller geometries on the semiconductor wafer. However, the rounding off effect caused by attenuated phase shift masks, such as mask 142 of FIG. 1B, lessens usefulness of very thin photoresist layers. The reason is that the adverse effects of photoresist loss result in a smaller usable depth of focus. Accordingly, the invention's advance in reducing the amount of photoresist loss is more significant when thinner photoresist layers are used.

Figure 12:
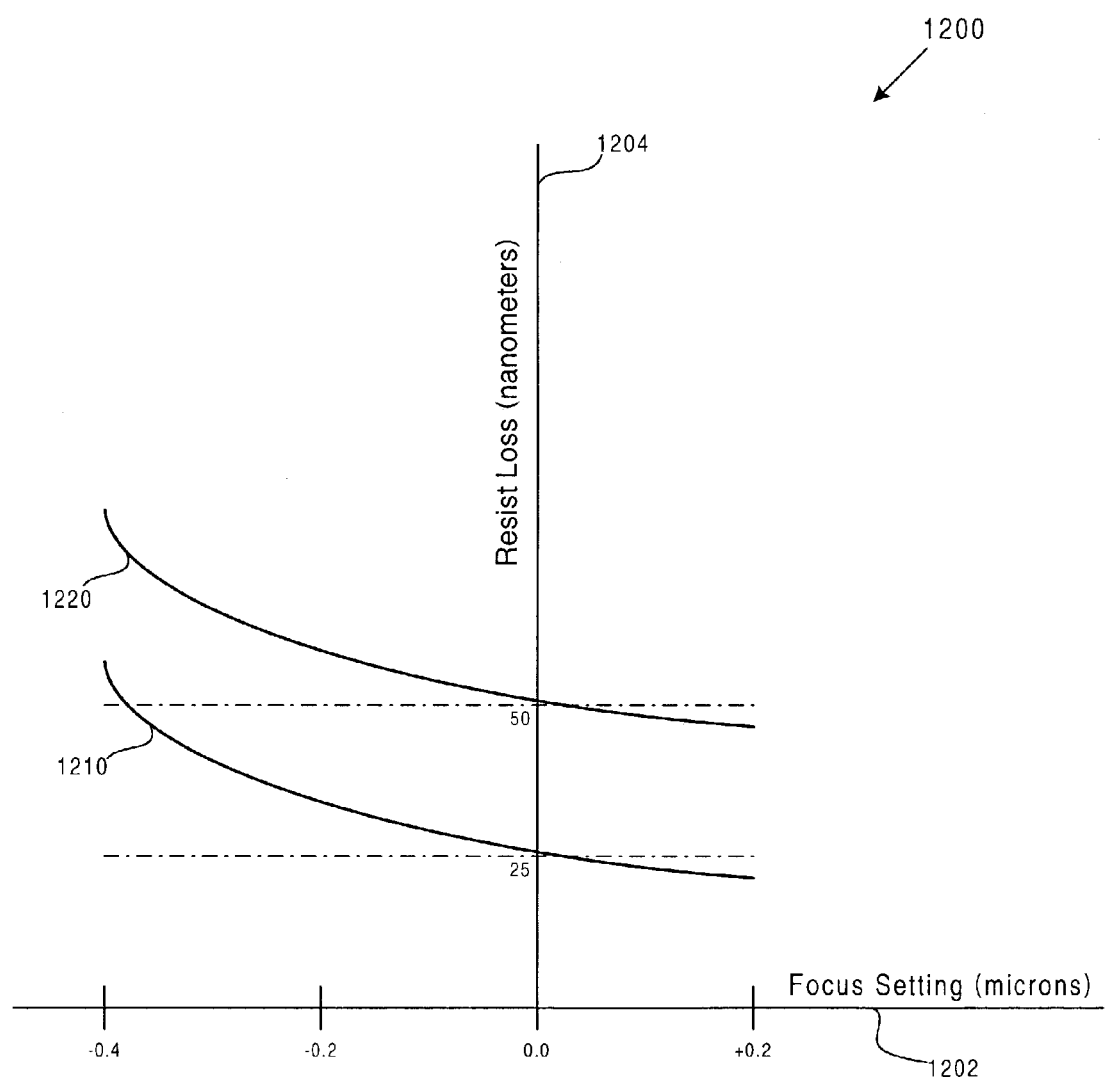
FIG. 12 is a graph comparing photoresist loss when the invention's mask is used with photoresist loss when an attenuated phase shift mask is used.

Graph 1200 in FIG. 12 illustrates the substantial reduction of photoresist loss achieved by the present invention. As shown in graph 1200, x-axis 1202 corresponds to the focus setting while y-axis 1204 corresponds to the amount of photoresist loss. Curve 1220 shows the amount of photoresist loss at various focus settings for a conventional attenuated phase shift mask such as that shown in FIG. 1B. Curve 1210 shows the amount of photoresist loss at various focus settings for the invention's phase shift mask. As an example, at a focus setting of 0.0 microns, approximately 50 nanometers of photoresist is lost from the photoresist layer when a conventional attenuated phase shift mask is used. Considering the fact that a typical photoresist layer has a thickness of approximately 440 nanometers, the loss of 50 nanometers is a significant loss. In contrast, the invention's phase shift mask results in merely 25 nanometers of photoresist loss at a focus setting of 0.0 microns. Thus, as shown in graph 1200 of FIG. 12, the invention results in a significant reduction of photoresist loss.

Figure 13:
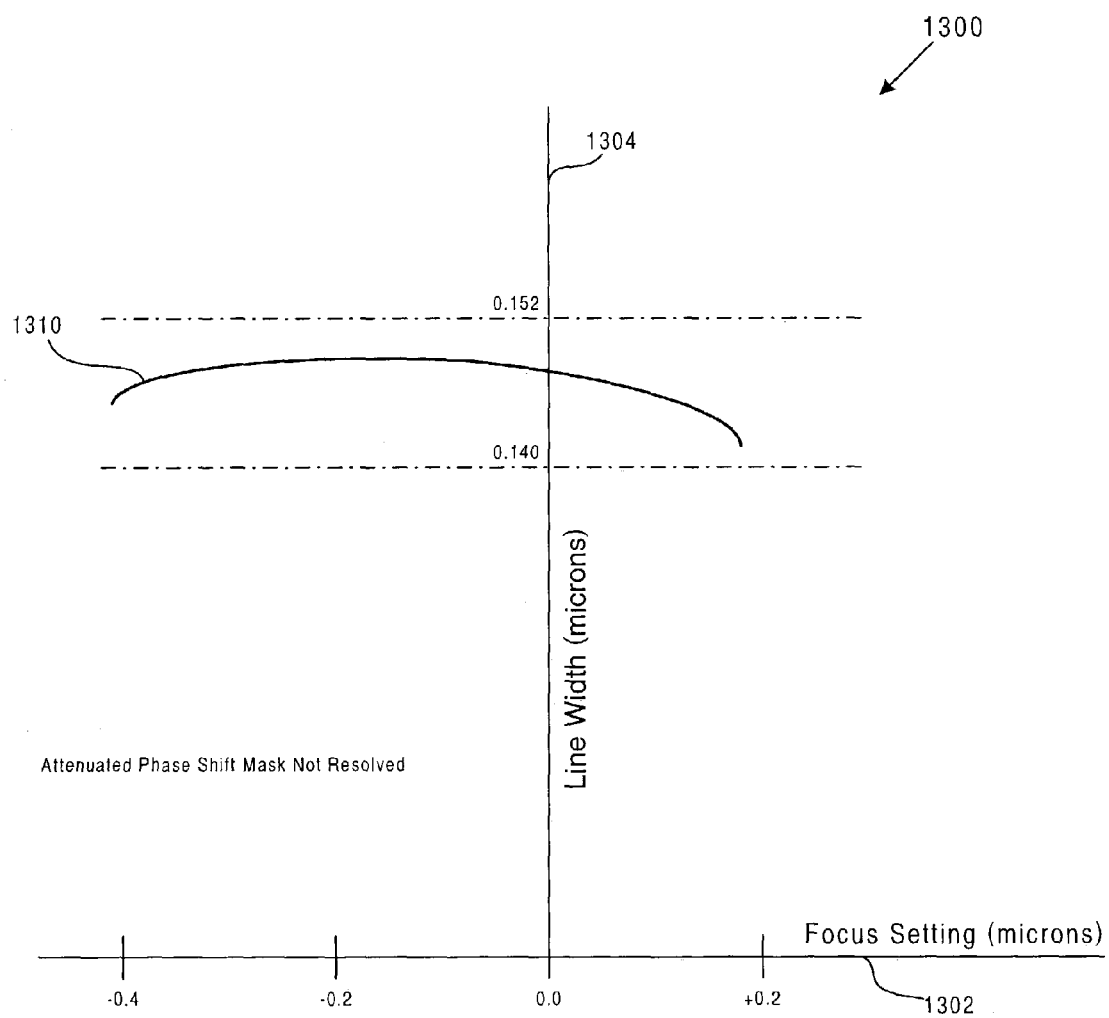
FIG. 13 is a graph illustrating the depth of focus achieved by the invention's mask for a pitch of 0.37 microns.

Graph 1300 in FIG. 13 illustrates another advantage of the invention's phase shift mask over a conventional attenuated phase shift mask such as that shown in FIG. 1B. In graph 1300 of FIG. 13, x-axis 1302 corresponds to the focus setting while y-axis 1304 corresponds to line width. Graph 1300 shows the consistent line width achieved when it is desired to resolve a pitch of 0.37 microns with the invention's phase shift mask. "Pitch" refers to the distance between the centers of two neighboring lines. Thus, a pitch of 0.37 microns refers to the distance in microns between the centers of two (parallel and neighboring) lines to be patterned on the semiconductor die.

Curve 1310 in graph 1300 shows the line width achieved by the invention's resolution enhancement phase shift mask. As shown by curve 1310, the invention's phase shift mask resolves a pitch of 0.37 microns at various focus settings with a line width between approximately 0.140 and 0.152 microns. However, with an attenuated phase shift mask such as that shown in FIG. 1B (i.e. an attenuated phase shift mask with a 6% transmission rate), a pitch of 0.37 microns cannot be resolved at all. In other words, it is not possible to achieve a focus and distinguish two neighboring lines whose centers are separated by 0.37 microns.

The invention's phase shift mask also has distinct advantages over alternating phase shift mask 102 of FIG. 1A. As discussed earlier in the present application, alternating phase shift mask 102 of FIG. 1A has an "intensity and image position imbalance" that must be fixed with the dual trench approach discussed above. The fabrication of a dual trench alternating phase shift mask is, however, complicated and expensive. Another disadvantage of the dual trench alternating phase shift mask (which is also a disadvantage of a conventional alternating phase shift mask) is that a two-mask method, also called a double exposure method, must be used to produce the final desired exposure pattern on the surface of the photoresist.

According to the dual trench alternating phase shift mask (or the conventional alternating phase shift mask), the use of a single mask results in creation of artifacts at the boundaries between the 0 degree phase shift and the 180 degree phase shift regions. Accordingly, a second mask is required for a second exposure in order to erase the artifacts created by the first mask during the first exposure. The requirement that two masks and two exposures must be used increases the complexity of the process, results in the need for an accurate alignment between the first and second exposures, reduces the throughput of processing the semiconductor wafer, and is more costly than the single mask, single exposure method of the present invention.

A recent variation to the alternating phase shift method contemplates use of four different phases of light, i.e. use of different regions causing a 0 degree phase shift, 60 degree phase shift, 120 degree phase shift, and 180 degree phase shift in an attempt to prevent creation of artifacts after the first exposure. Although this type of alternating phase shift method is a single mask, single exposure method, the mask is extremely expensive to manufacture.

Another advantage of the invention's phase shift mask is the fact that it can exhibit a significantly lower mask error factor ("MEF") compared to either the alternating phase shift mask (such as mask 102 shown in FIG. 1A) or the attenuated phase shift mask (such as mask 142 shown in FIG. 1B). The mask error factor or MEF is an indication of how much the mask would magnify (or reduce) an error in the size of the smallest feature sizes, i.e. an error in the width of lines that are supposed to have the minimum width in a semiconductor fabrication process.

For example, suppose that a particular semiconductor fabrication process has a minimum line width of 0.15 microns. Suppose further that a photolithographic mask is to expose the photoresist on the surface of the semiconductor wafer in a manner that an image having a width of 0.15 microns is produced which would ultimately result in a line on the semiconductor wafer with a width of 0.15 microns. If such an image is to be produced at two different locations on the photoresist, the mask pattern which is to produce the 0.15 micron image may be sized perfectly at the first location while the mask pattern which is to produce the 0.15 micron image at the second location may be oversized by, for example, 10%. If the MEF is equal to 1.0, the image produced on the surface of photoresist at the second location would be 10% larger than the image produced on the surface of photoresist at the first location. In other words, the image produced for the first line would have a width of 0.150 microns while the image produced for the second line would have a width of 0.165 microns.

If the MEF is equal to 2.0, the 10% error on the mask is magnified such that the image on the photoresist layer corresponding to the second line would be 20% wider than the image corresponding to the first line. In other words, the image produced for the first line would have a width of 0.150 microns while the image produced for the second line would have a width of 0.180 microns. On the other hand, if the MEF is equal to 0.5, the image produced on the surface of photoresist would be only 5% larger for the second line. In other words, the image produced for the first line would have a width of 0.150 microns while the image produced for the second line would have a width of 0.1575 microns. Manifestly, a small MEF is desirable to accurately image minimum widths on the surface of the photoresist and in fact to compensate for undesired variations (i.e. errors) in the width of small feature sizes on the mask. Thus, an MEF of 0.5 in fact compensates for undesired errors on the mask and results in better uniformity in the size of small features on the photoresist layer.

The phase shift mask of the present invention can achieve an MEF of approximately 0.1. In other words, the invention's phase shift mask actually results in a dramatic reduction of the effects of any errors on the mask itself. In contrast, an alternating phase shift mask such as mask 102 in FIG. 1A typically achieves an MEF of approximately 0.5 while an attenuated phase shift mask such as mask 142 in FIG. 1B has an MEF that is considerably greater than 0.5.

As described above, the present invention has overcome the need in the art for a photolithographic mask for rendering sharp images of smallest feature sizes with a balanced intensity of light. The invention's resolution enhancement phase shift mask can be manufactured by using a simple process which results in a reduction in the complexity and expense of manufacturing photolithographic masks. Moreover, the invention can be used in a single mask, single exposure mode to reduce the complexity and expense of producing a desired exposure pattern on the underlying photoresist layer while increasing the throughput of the semiconductor wafer fabrication process.

It is noted that although the invention was described with respect to specific embodiments, the principles of the invention, as defined by the claims appended herein, can obviously be applied beyond the specifically described embodiments of the invention described herein. For example, in the present application quartz and CaF were used as exemplary materials for clear regions of the mask and chrome was used as an exemplary material for opaque regions of the mask. However, a substantially clear material other than quartz or CaF, and a substantially opaque material other than chrome may be used without departing from the scope of the present invention as disclosed and claimed in the present application.

Thus, a transparent phase shift mask for fabrication of small feature sizes has been described.

What is claimed is:

1. A mask comprising:
    a transparent substrate, said transparent substrate having a first clear region, a second clear region and a third clear region;
    an opaque film situated over at least a portion of said transparent substrate to define an opaque region;
    said second clear region contiguous to a first side of said first clear region;
    said third clear region contiguous to a second side of said first clear region;
    said first clear region causing a phase shift in light passing through said first clear region by 180 degrees relative to a phase of light passing through each of said second and third clear regions;
    said first, second, and third clear regions causing destructive interference of light passing through said first, second, and third clear regions;
    said opaque region adjacent to one of said first, second and third clear regions;
    wherein said transparent substrate has a different thickness in said first clear region than in said second and third clear regions.

2. The mask of claim 1 wherein said first clear region is a rectangle having first and second long sides and first and second short sides, and wherein said first long side is said first side of said first clear region and said second long side is said second side of said first clear region.

3. The mask of claim 2 wherein said first and second short sides of said rectangle are substantially equal to a smallest feature size in a semiconductor fabrication process.

4. The mask of claim 1 wherein said destructive interference of light passing through said first, second, and third regions produces an image corresponding to a first geometry and a first plurality of dimensions of said first region.

5. The mask of claim 4 wherein said image is a line having a width equal to a smallest feature size in a semiconductor fabrication process.

6. The mask of claim 1 wherein said transparent substrate is made of quartz.

7. The mask of claim 1 wherein said transparent substrate is made of calcium fluoride.

8. The mask of claim 1 wherein said opaque film comprises chrome.

9. A method for making a mask, said method comprising the steps of:
    depositing a layer of a substantially opaque film on a transparent substrate;
    designating a first region of said layer as corresponding to a non-phase shift region on said transparent substrate, designating a second region of said layer as corresponding to a phase shift region on said transparent substrate, and designating a third region of said layer as an opaque region on said transparent substrate;
    etching said layer so as to cause said substantially opaque film to be removed from said second region of said layer;
    reducing a thickness of said transparent substrate in said phase shift region of said transparent substrate;
    removing said substantially opaque film from said first region of said layer;

said phase shift and non-phase shift regions causing destructive interference of light passing through said phase shift and non-phase shift regions.

10. The method of claim 9 wherein said first region of said layer is contiguous to and surrounds said second region and said third region.

11. The method of claim 9 wherein said phase shift region causes a phase shift of 180 degrees in light passing through said phase shift region relative to a phase of light passing through said non-phase shift region.

12. The method of claim 9 wherein said phase shift region is a rectangle having first and second long sides and first and second short sides, and wherein said first and second short sides of said rectangle are substantially equal to a smallest feature size in a semiconductor fabrication process.

13. The method of claim 9 wherein said destructive interference of light passing through said phase shift and non-phase shift regions produces an image corresponding to a first geometry and a first plurality of dimensions of said non-phase shift region.

14. The method of claim 13 wherein said image is a line having a width substantially equal to a smallest feature size in a semiconductor fabrication process.

15. The method of claim 9 wherein said transparent substrate is made of quartz.

16. The method of claim 9 wherein said transparent substrate is made of calcium fluoride.

17. The method of claim 9 wherein said substantially opaque film comprises chrome.

18. A method of using a mask, said method comprising the steps of:

creating an image in a single exposure using a single mask, said image including an unexposed line, first and second exposed regions, and an unexposed region, said unexposed line caused by destructive interference of light passing through first and second clear regions and a third clear region of said mask, said first and second exposed regions, respectively, corresponding to first and second clear regions of said mask, said unexposed region corresponding to an opaque region of said mask;

said third clear region of said mask causing a phase shift in light passing through said third clear region by 180 degrees relative to a phase of light passing through each of said first and second clear regions;

wherein said mask has a different a thickness in said third clear region than in said first and second clear regions.

19. The method of claim 18 wherein said first, second and third clear regions comprise one of quartz or calcium fluoride.

20. The method of claim 18 wherein said opaque region comprises chrome.

* * * * *